(12) United States Patent
Atwell et al.

(10) Patent No.: US 6,646,941 B1
(45) Date of Patent: Nov. 11, 2003

(54) APPARATUS FOR OPERATING AN INTEGRATED CIRCUIT HAVING A SLEEP MODE

(75) Inventors: William Daune Atwell, Spicewood, TX (US); Michael L. Longwell, Austin, TX (US); Jeffrey Van Myers, Driftwood, TX (US)

(73) Assignee: Madrone Solutions, Inc., Austin, TX (US)

( * ) Notice: Subject to any disclaimer, the term of this patent is extended or adjusted under 35 U.S.C. 154(b) by 0 days.

(21) Appl. No.: 09/303,223

(22) Filed: Apr. 30, 1999

(51) Int. Cl.$^7$ ................................. G11C 7/00
(52) U.S. Cl. ................... 365/222; 365/230.06
(58) Field of Search ................. 365/222, 230.06

(56) References Cited

U.S. PATENT DOCUMENTS 5,963,497 A * 10/1999 Holland ................ 365/222

* cited by examiner

*Primary Examiner*—Huan Hoang
(74) *Attorney, Agent, or Firm*—Jeffrey Van Myers

(57) ABSTRACT

An apparatus for operating a dynamic memory (11) in a sleep mode. The apparatus writes a predetermined background value to at least a background portion of the memory, and then ceases to refresh the background portion. The background value corresponds to the conductivity type of the memory cell, where N-channel devices have a low value and P-channel devices have a high value. After return from sleep mode, the voltage reference is not impacted by the residual charge in the memory cells. According to one embodiment, a refresh controller (112) accesses a look up table (106) to store data indicating the status of memory cells. Prescaling may then adjust the period and duty cycle of the refresh cycle in response to the inactive wordlines via a unit, such as prescaler (122). In one embodiment, the background value is written to the inactive memory cell (152) via sense amplifier killer circuitry (154).

45 Claims, 16 Drawing Sheets

APPARATUS FOR OPERATING AN INTEGRATED CIRCUIT HAVING A SLEEP MODE

REFERENCE TO CO-PENDING APPLICATIONS

"METHOD FOR OPERATING AN INTEGRATED CIRCUIT HAVING A SLEEP MODE" by Michael L. Longwell, et al., application Ser. No. 09/303,284 and assigned to the assignee hereof and filed concurrently herewith.

FIELD OF THE INVENTION

The present invention relates to integrated circuits, and more specifically to integrated circuit memories.

BACKGROUND OF THE INVENTION

With each new generation of semiconductor memory, the size and power requirements of the memory array becomes more demanding. For example, when moving from a 4 Mb technology to a 16 Mb design, the array area must be increased in order to accommodate the additional memory cells. Increasing the array size, however, adversely effects certain electrical parameters required for optimal circuit performance.

In many applications, such as hand-held, battery powered devices, a low power mode is used to reduce the power consumption of the memory device. Sleep modes are desirable is such applications as they increase the battery life of the device. Sleep modes which provide finer granularity without compromising data integrity are highly desirable. Additionally, as the memory array increases, it is inefficient to refresh an entire dynamic memory array where only a portion of the array will be used for an extended time period.

As the speed of these applications increases, it becomes more and more difficult to maintain the integrity of the memory cells as operation switches from normal operating to a low power operating mode and back. Most high density dynamic memory cells are dependent, sharing a plate reference voltage supplied by a nonideal source. Charge injected into a group of storage nodes may effect the quality and integrity of other storage nodes, causing malfunction.

Accordingly, a need exists for an efficient way to operate memory devices which reduces the power consumption of the memory.

BRIEF DESCRIPTION OF THE DRAWINGS

The present invention may be more fully understood by a description of certain preferred embodiments in conjunction with the attached drawings in which.

DETAILED DESCRIPTION OF THE PREFERRED EMBODIMENTS

Figure 1:
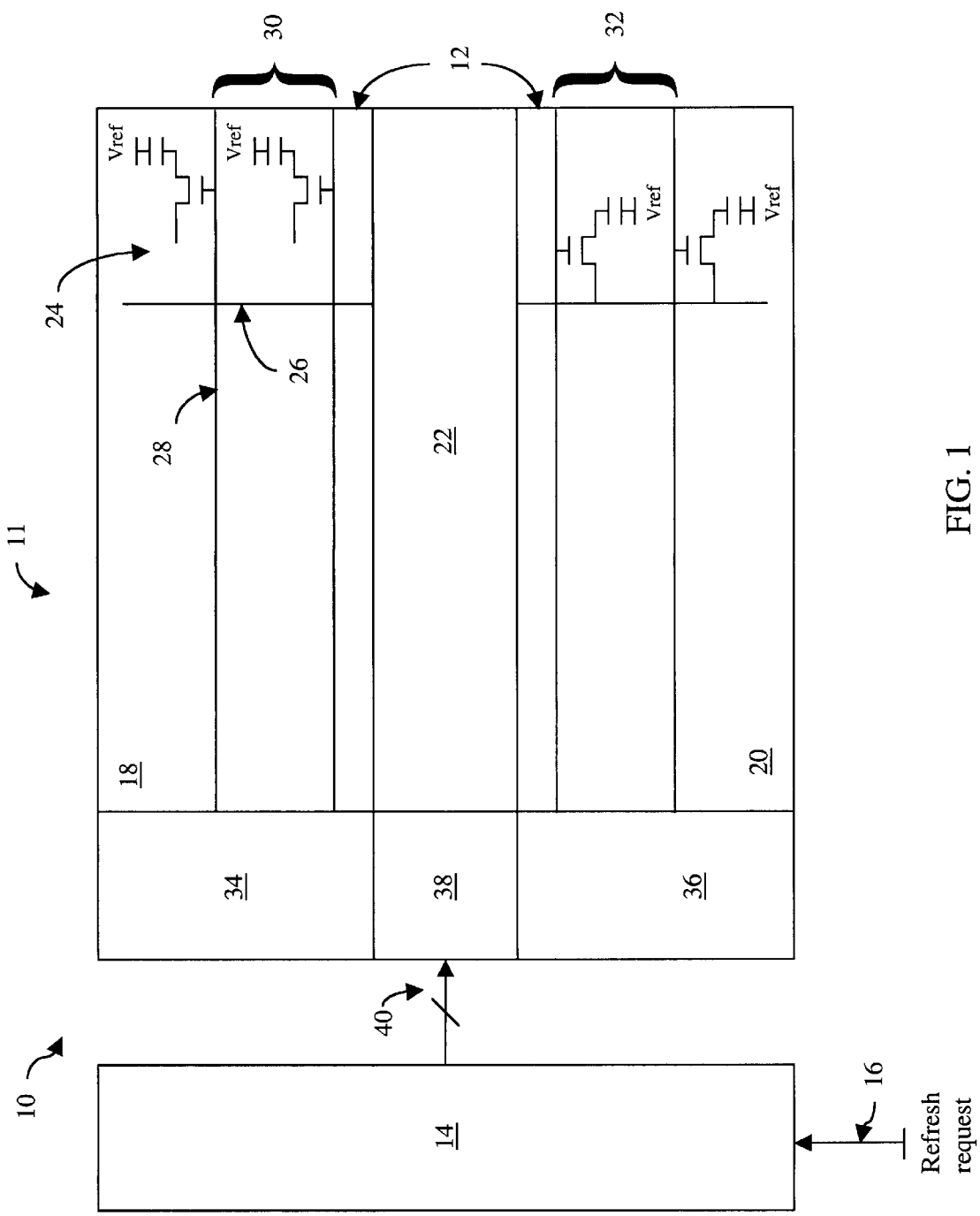
FIG. 1 illustrates in block diagram form a portion of an integrated circuit which is in accordance with one embodiment of the present invention.

For clarity, much of the following discussion describes various aspects of the present invention with respect to a dynamic memory having an N-channel conductivity type. Note that the present invention is applicable to other devices as well, such as P-channel conductivity type devices.

Additionally, throughout this description the terms "assert" and "negate" will be used when referring to the rendering of a signal, status bit, or similar apparatus into its logically true or logically false state, respectively. Similarly, with respect to information or data stored in a memory, a "zero" value is a low potential value, and a "one" is a high potential value. Additionally, with respect to a dynamic memory, "active" is used to describe memory cells which are to be refreshed, while "inactive" is used to describe memory cells which will not be refreshed during a sleep mode, a low power mode, a low noise mode, or any other mode where at least a portion of the memory is not refreshed.

In one aspect of the present invention, a method for operating a dynamic memory in a sleep mode includes the steps of writing a predetermined background value to at least a background portion of the memory, and then ceasing to refresh the background portion.

Another aspect of the present invention provides a method for use in an integrated circuit comprising a plurality of memory cells, each having an active state and a sleep state. The method includes several steps, where initially in response to a first control signal, the method partitions the memory into a first portion of memory cells and a second portion of memory cells. Next, in response to a second control signal, the method places each memory cell in said first portion in the sleep state by writing the predetermined voltage level to said memory cell when said memory cell is selected for refresh during a first refresh cycle following said second control signal. Thereafter, the method maintains the second portion of the memory in the active state by periodically refreshing only the memory cells in the second portion.

According to one other aspect of the present invention, a method for operating a dynamic memory includes the steps of selectively partitioning the memory into first and second portions, forcing the first portion of the memory into a sleep state, and thereafter, maintaining the second portion of the memory in an active state by periodically refreshing only the second portion.

According to yet another aspect of the present invention, a method for use in an integrated circuit having a memory comprising a plurality of memory cells, each having an active state and a sleep state, includes the steps of selectively partitioning the memory into a first portion of memory cells and a second portion of memory cells, placing the first portion of the memory in the sleep state by writing a predetermined voltage level to each memory cell in the first portion, and thereafter, maintaining the second portion of the memory in the active state by periodically refreshing only the memory cells in the second portion.

The present invention provides an integrated circuit including a memory and a refresh controller, the memory having a plurality of dynamic memory cells arranged in a plane of rows and columns. The refresh controller includes a row refresh circuit connected to the memory to refresh a selected row of memory cells, and a row select circuit connected to the row refresh circuit to select a first row of the memory to be refreshed, and then select a second row of the memory to be refreshed, wherein the first and second rows may be any two rows of the memory.

The present invention also provides a refresh controller for use in an integrated circuit having a memory and a refresh controller, the memory having a plurality of dynamic memory cells arranged in rows and columns. The refresh controller includes a row refresh circuit connected to the memory to refresh a selected row of memory cells, and a row select circuit connected to the row refresh circuit to select a first row of the memory to be refreshed, and then select a second row of the memory to be refreshed, wherein the first and second rows may be any two rows of the memory.

Further, the present invention provides a method of writing each memory cell in a memory array to a predetermined background value prior to entering a sleep mode. Upon return from the sleep mode, the background value prevents long term damage to the dielectric of the storage capacitors and/or short term corruption of data.

The present invention provides a refresh controller for use in an integrated circuit having a memory, the memory having a plurality of dynamic memory cells arranged in rows and columns. The refresh controller includes a row refresh circuit connected to the memory to refresh a selected row of memory cells, a row select circuit connected to the row refresh circuit to select a first row of the memory to be refreshed, and then select a second row of the memory to be refreshed, wherein the first and second rows may be any two rows of the memory, and a sleep circuit to write a sleep value once to each memory cell in all rows of the memory other than the first and second rows.

The present invention also provides a method of pipelining refresh cycles in a memory device. In one embodiment, status information stored in a look up table provides the state of each wordline or group of wordlines. The state indicates whether that wordline or group of wordlines is to be refreshed or is to sleep. This status information is then used to control the refresh operation. For each refresh cycle, the status information is retrieved from the look up table, where each datum corresponds to an address in the memory array. By storing the datum for a given memory address in the location of the look-up table corresponding to an adjacent address, the status information for each address is provided one refresh cycle earlier. In this way the data is shifted so as to provide the active/inactive state of the next memory address when the current address is requested by a refresh controller. In effect, the status information is retrieved ahead of time in preparation for the refresh cycle, thus pipelining the refresh operation. Therefore, the refresh cycle is not delayed by retrieval of the status information from the look up table. The pipeline refresh reduces latency in the refresh operation by reducing the time required to retrieve the current status information, and thus increasing the speed of operation of the memory device.

In one embodiment of the present invention, a prescaler adjusts the period of each refresh cycle according to the number of active wordlines. If there are inactive wordlines, i.e. wordlines put into a sleep mode and not refreshed, the time that would have been expended on refreshing inactive wordlines may be used to spread out the refreshing of the active wordlines. In this way, the refresh signals are distributed and the spectra of noise spikes associated with those signals are spread. In an alternate embodiment, the prescaler includes a dithering means which introduces an irregularity into the occurence of the refresh signals. Here the refresh signals are generated at slightly different times within the refresh period. According to one embodiment, a look-up ROM is used with the prescaler, and provides information that maps the number of active wordlines to the refresh timing.

FIG. 1 illustrates, in block diagram form, a portion of an integrated circuit 10 in accordance with one embodiment of the present invention. In this particular embodiment, integrated circuit 10 includes a memory 11 coupled to a refresh controller 14. The memory 11 includes memory array 12 which has two banks of memory, bank 18 and bank 20. The refresh controller 14 provides control signals to refresh memory cells within memory 11. The refresh controller 14 receives a refresh request signal via conductor(s) 16. The refresh request signal initiates a refresh operation within memory array 12 of memory 11. The refresh controller 14 provides refresh control signals to memory array 12 via conductor(s) 40. Note that memory array 12 may be a tiled memory array, or any other configuration of memory, such as those described in "TILED MEMORY AND MEMORY TILE FOR USE THEREIN" by William Daune Atwell, et al., having application Ser. No. 09/286,178, "MEMORY TILE FOR USE IN A TILED MEMORY" by Michael L. Longwell, et al., having application Ser. No. 09/286,196, "METHOD FOR DESIGNING A TILED MEMORY" by William Daune Atwell, et al., having application Ser. No. 09/286,186, "METHOD FOR DESIGNING A MEMORY TILE FOR USE IN A TILED MEMORY" by Michael L.

Longwell, et al., having application Ser. No. 09/286,201, and "DISTRIBUTED CHARGE SOURCE" by Jeffrey Van Myers, et al., having application Ser. No. 09/286,188, all of which are assigned to the assignee hereof and the subject matter of each of the foregoing applications is expressly incorporated herein by reference.

The memory array 12 includes sense amplifier 22 coupled between bank 18 and bank 20. The sense amplifier 22 includes a plurality of individual sense amplifiers. Each bank includes a plurality of memory cells, such as memory cell 24, each addressed by a unique wordline, bitline combination. For example, memory cell 24 is addressed by bitline 26 and wordline 28. As illustrated in FIG. 1, a first set of memory cells 30 is illustrated in bank 18 and a second set of memory cells 32 is illustrated in bank 20. The bank 18 has an associated row select 34 and the bank 20 has an associated row select 36. The memory array 12 also includes a controller 38 which controls accesses to memory cells within memory array 12.

According to one embodiment, integrated circuit 10 is a dynamic random access memory (DRAM) system, including multiple memory arrays as memory array 12. DRAM memories require memory cell refresh periodically, where the value stored on the capacitor of each memory cell is first sensed by sense amplifier 22. The value is then written back into the memory cell and stored on the capacitor. The refresh controller 14 receives a refresh request signal and in response generates refresh control signals, which may include address, RAS, and/or CAS. The refresh control signals are provided to controller 38 which then accesses the designated memory cell.

Refreshing involves sensing or reading the value present in the memory cell and then enforcing or writing it back into the memory cell. Refreshing is necessary in memories such as DRAMs, where any access to the memory cell is destructive. As the access destroys the data in the memory cell, it must be written back into the memory cell to maintain data integrity. This is true even of a read access. Write operations are performed in cycles, where a predetermined number of bits are written on each cycle. During a write cycle, bits in the wordline which are not written to are refreshed.

Figure 2:
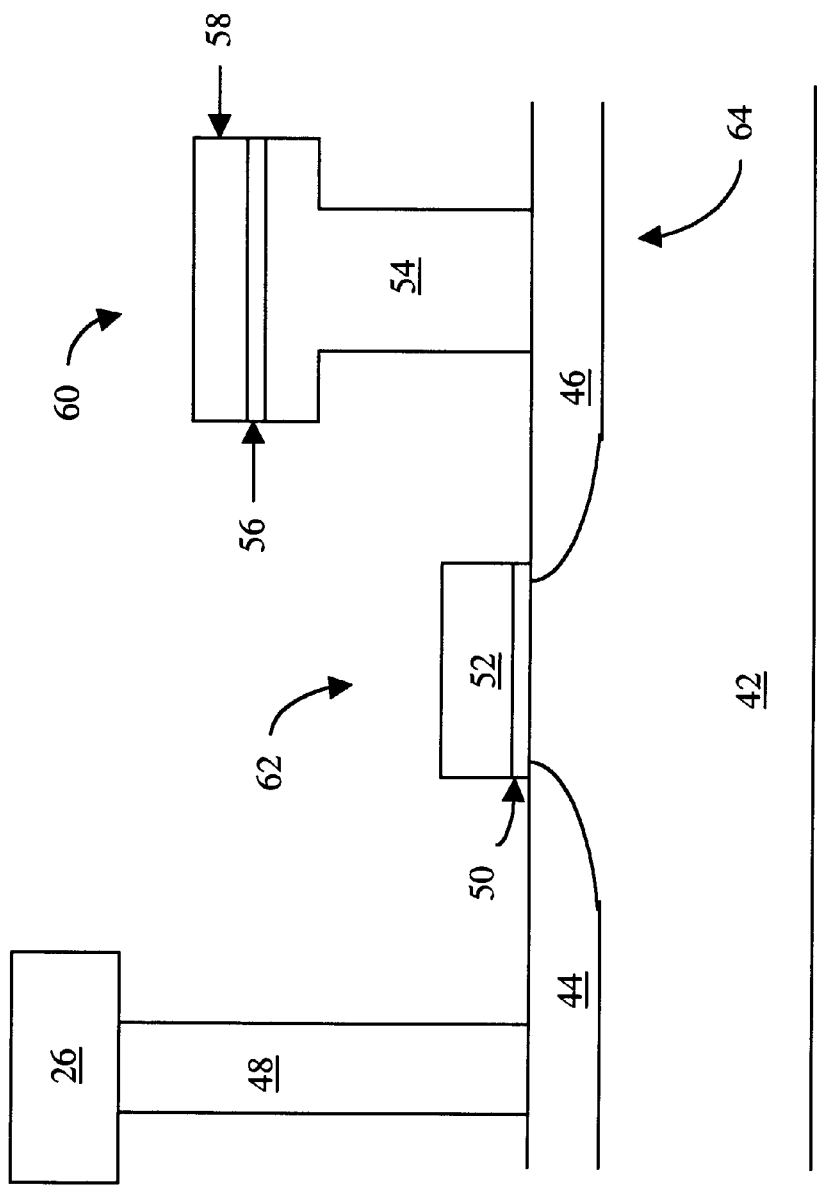
FIG. 2 illustrates in cross sectional form a memory cell as in FIG. 1, which is in accordance with one embodiment of the present invention.

Each memory cell within memory array 12 of FIG. 1 includes a pass transistor and a storage capacitor, as illustrated by memory cell 24. This is a typical DRAM configuration, where the charge stored on the capacitor is the data stored in the memory cell. Illustrated in FIG. 2 is a cross sectional view of memory cell 24 of FIG. 1, which is in accordance with one embodiment of the present invention. The memory cell 24 comprises a pass transistor 62 and a storage capacitor 60. In this particular embodiment, storage capacitor 60 is illustrated as a stacked capacitor. It should be appreciated, however, that storage capacitor 60 may also be formed using a trench-capacitor, a planar capacitor, or the like. The pass transistor 62 comprises a doped region 44, a doped region 46, a gate dielectric 50, and a gate electrode 52. The gate electrode 52 overlies gate dielectric 50 and selectively couples doped region 44 to doped region 46. Note, that a portion of wordline 28 forms gate electrode 52.

The bitline contact 48 electrically couples doped region 44 to bitline 26. In this particular embodiment, storage capacitor 60 comprises bottom capacitor plate 54, capacitor dielectric layer 56, and top capacitor plate 58. The bottom capacitor plate 54 is electrically coupled to doped region 46. The bottom capacitor plate 54 and doped region 46 form a storage node 64. The top capacitor plate 58 is coupled to a reference voltage, Vref, which is usually a function of Vdd and is typically equal to Vdd/2. Note, that top capacitor plate 58 typically forms the top capacitor plate for multiple memory cells within memory array 12. The charge stored on storage node 64 changes over time due to subthreshold leakage through pass transistor 62 and also due to reverse bias leakage of the PN junction formed between doped region 46 and substrate 42. Therefore, the charge stored on storage node 64 must be periodically refreshed in order for memory cell 24 to retain its contents.

Figure 3:
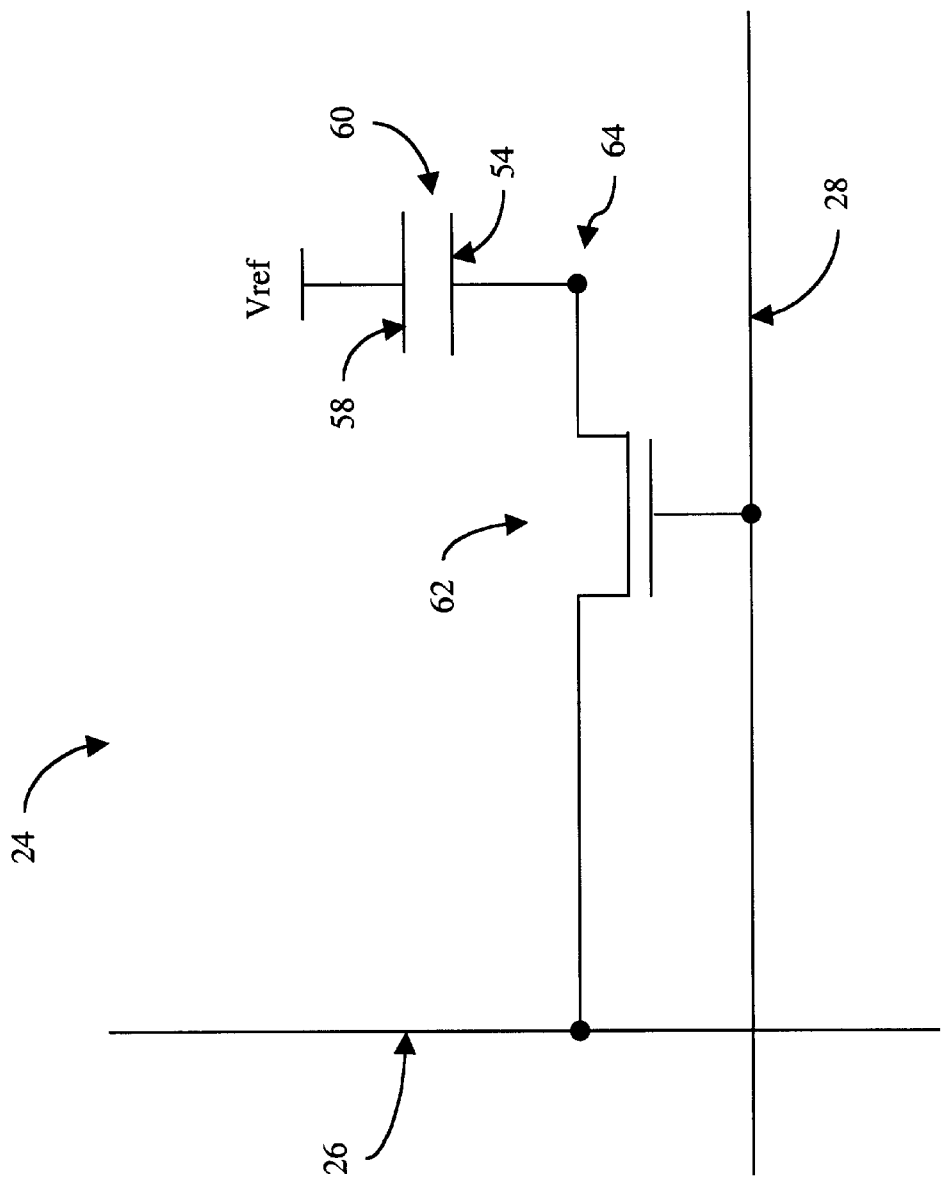
FIG. 3 illustrates in circuit diagram form a memory cell as in FIG. 2 which is in accordance with one embodiment of the present invention.

The memory cell 24 is further illustrated in circuit schematic form in FIG. 3, where bitline 26 and wordline 28 identify memory cell 24. Here the top capacitor plate 58 of capacitor 60 is coupled to Vref and the voltage potential of the bottom capacitor plate 54 is identified as Vnode. The bulk of pass transistor 62 is substrate 42, illustrated in FIG. 2.

With respect to memory operations such as write, read, and/or refresh, the charge on the individual capacitor of each memory bit is given by the following equation:

$$Q=CV$$

where Q is the unit of charge, C is the capacitance of the capacitor, and V is the voltage difference required to transfer the charge Q between the two plates of the conductor. C is determined by the material between the plates of the conductor and the distance between the plates. As is easily understood, since C is a function of the physical makeup of the capacitor and is therefore a fixed value per capacitor, the more charge required on the capacitor, the greater voltage required to store the charge.

According to one embodiment, writes are performed for a byte (8 bits) per cycle. Wordlines include 128 bytes or 1024 bits. For each write cycle, 8 bits are written and 1016 bits are refreshed. During a refresh operation, 1024 bits are refreshed as the entire wordline is refreshed. A read operation is similar to a refresh, where 1024 bits are refreshed while 8 bits are selected for output. For a row having a majority of memory cells with high logic value, the potential of impairing Vref due to deteriorated voltage on the unrefreshed capacitors is great. In this case, the deteriorated voltage per capacitor increases the requirement of charge per capacitor. When multiplied by many memory cells, the voltage that Vref must supply becomes too large, causing malfunction or even damage to the memory array 12.

Figure 4:
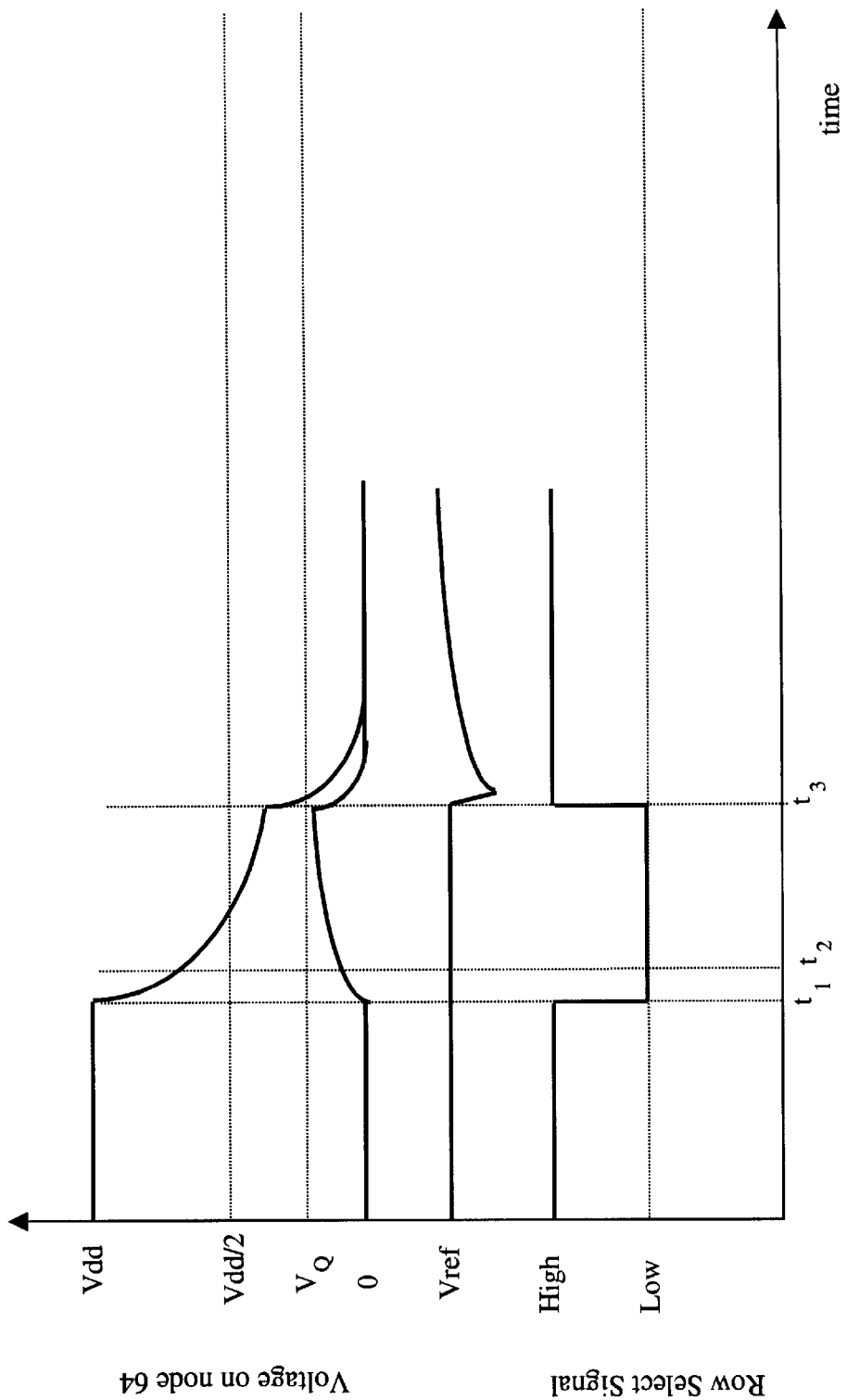
FIG. 4 illustrates in timing diagram form operation of a memory cell as in FIG. 2 which is in accordance with one embodiment of the present invention.

FIG. 4 illustrates the behavior of memory cell 24 when memory cell 24 is not refreshed. The vertical axis of FIG. 4 represents the voltage at storage node 64 for two cases. In the first case, a logical high value is stored in storage capacitor 60 of memory cell 24, where pass transistor 62 is an NMOS transistor. In the second case, a logical low value is stored in storage capacitor 60 of memory cell 24. Also shown in FIG. 4 are a row select signal and Vref. The row select signal is a decoded address signal qualified by a RAS signal. Initially, the row select signal is asserted indicating an access to memory cell 24. According to one embodiment of the present invention, the row select signal is a logic high active signal, where assertion of the row select signal is defined when the row select signal is at a high logic level. Alternate embodiments may employ an alternate scheme. At time $t_1$, the row select signal is negated indicating an end to the access of the memory cell.

Referring to FIG. 4, in the first case, while the row select signal is asserted, Vnode is at approximately Vdd, and capacitor 60 holds a charge of approximately C(−Vdd/2). Subsequent to negation of the row select signal at time $t_1$, the voltage of Vnode decreases due to leakage mechanisms.

More specifically, subthreshold leakage through pass transistor 62 and reverse biased diode leakage through the diode formed between doped region 46 and substrate 42. An additional leakage mechanism provides leakage through the capacitor dielectric layer 56 of capacitor 60.

In the second case, while the row select signal is asserted, Vnode is at approximately 0V, and and capacitor 60 holds a charge of approximately C(+Vdd/2). Subsequent to negation of the row select signal at time $t_1$, the voltage of Vnode is held low by reverse biased diode leakage, but pulled high by transistor subthreshold leakage and dielectric leakage, more specifically, subthreshold leakage through pass transistor 62 and the diode formed between doped region 46 and substrate 42. An additional leakage mechanism provides leakage through the capacitor dielectric layer 56 of capacitor 60.

With respect to an N-channel device, there are two significant leakage mechanisms for a dynamic memory cell, reverse bias diode leakage from the storage node and subthreshold leakage current through the storage switch or pass transistor. The reverse bias diode leakage will tend to pull Vnode to a low voltage level. In an N-channel device, the effect of the subthreshold leakage is most significant when lowering the voltage potential of Vnode, i.e. pulling Vnode from a high potential to a low potential. In contrast, when raising the voltage potential of Vnode, there is a subthreshold leakage, but it is restricted due to other conditions. To pull Vnode from a low potential to a high potential, the subthreshold leakage mechanism is self limiting due to changes in the gate to source voltage of the pass transistor. Note that while the N-channel device is discussed in detail throughout, the same leakage mechanisms are present in a P-channel device where the polarities are reversed. In the second case, the voltage degradation is small in comparison to the first case. In both cases, Vref is relatively constant.

Typically the memory cell is refreshed at time $t_2$, subsequent to negation of the row select signal, i.e. after access to the memory cell. As illustrated in FIG. 4, when memory cell 24 is not refreshed at time $t_2$, the leakage mechanisms continue to degrade the voltage level of Vnode. Note that both the first case and the second case tend toward a quiescent voltage level, $V_Q$.

Degradation of the voltage level of Vnode produces spurious results in data stored in memory cell 24 and negatively affects the performance of the memory device. In the first case, accesses to memory cell 24 subsequent to time $t_2$ may read a logical one stored in memory cell 24 as a logical zero due to the degraded voltage level of Vnode. If memory cell 24 is incorrectly read, on refresh the bitline 26 will drive Vnode to 0V. During refresh multiple memory cells are accessed, where all memory cells are coupled to a common reference voltage, Vref. As illustrated in FIG. 4, the leakage mechanisms associated with the first case have a greater potential to degrade the voltage level of Vnode.

At time $t_3$ the row select signal is again asserted. In the first case the voltage level of Vnode is incorrectly read and refreshed as a logical zero. In the second case the voltage level of Vnode decreases back to a ground level. For both cases, a voltage spike is seen on Vref. When multiple bits are accessed concurrently, this voltage spike becomes large and potentially impacts other memory cells in the array or the future performance of the memory device.

Figure 5:
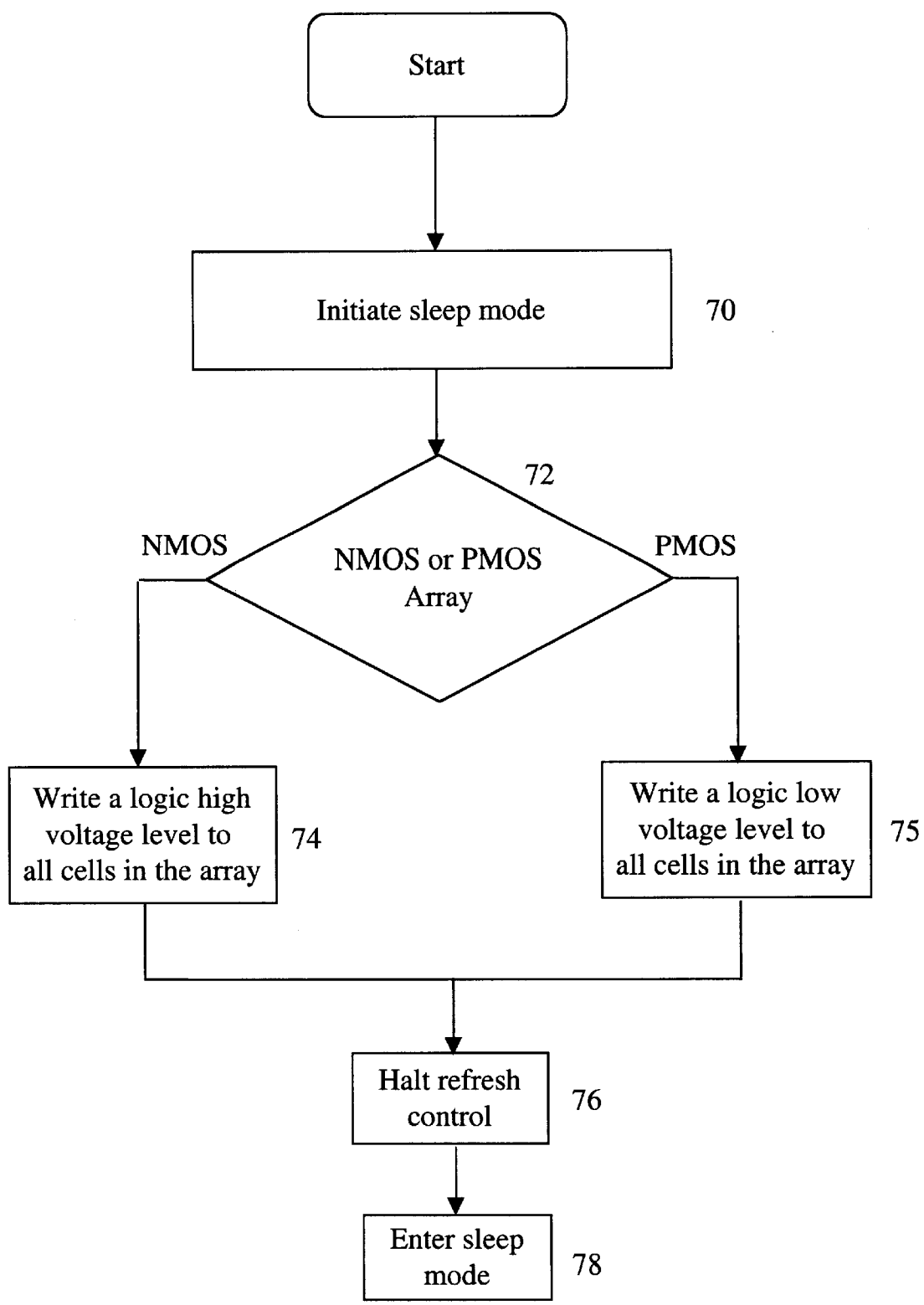
FIG. 5 illustrates in flow diagram form a method for operating a memory device having a low power mode which is in accordance with one embodiment of the present invention.

FIG. 5 illustrates in flow diagram form a process for initiating and entering a low power mode in an integrated circuit. The process begins at block 70 where the low power mode is initiated. In one embodiment, the integrated circuit is a memory device and initiation of the low power mode may be performed via refresh control signals, or may be initiated by another controller, such as a direct memory access (DMA) controller or a dedicated sleep mode microcontroller. The process flow continues to decision diamond 72 to determine if the memory cell is an n-channel or a p-channel device, and continues to block 74 and block 75, where a predetermined logic value is written to bits in a memory array, such as memory array 12. In block 74 a logical low value is written to bits in the n-channel memory cells and in block 75 a logical high value is written to bits in the p-channel memory cells. For n-channel devices, the logical low value ensures that all memory cells are in a low voltage state prior to entering low power mode. In this way, on return from low power mode, the voltage level of Vnode does not degrade sufficiently to affect the reference voltage, Vref. Similarly, for p-channel devices, the logical high value ensures that all memory cells are in a high voltage state prior to entering low power mode, preventing negative affects to Vref on return from low power mode. This is a preparatory step that is not necessary to enter low power mode, but prevents draining Vref, corrupting data and overstressing the dielectric layer on return from low power mode.

From block 74 and from block 75, processing continues to block 76 to halt refresh control. At this point, the memory device enters low power mode at block 78. The method illustrated in FIG. 5 allows the memory array to become active immediately without producing spurious data in the memory cells, and without pulling excessively on Vref. Typically, on return from low power mode to active mode, each bit in the memory array is refreshed. The method of the present invention allows any access after return from low power mode without placing an excessive draw on Vref. Note that Vref is typically a common plane for all bits in the memory array, and any bit may therefore inpact all bits if Vref is damaged or impaired. This is particularly important as the operational speed of applications incorporating such memories increases and the need to manage various areas of memory becomes critical.

Note that the background portion of the memory may be selectively returned to an active mode. For example, referring to FIG. 1, where the first set of memory cells 30 and the second set of memory cells 32 are both in a sleep mode while the rest of memory array 12 is refreshed, the memory 11 may decide to made the second set of memory cells 32 active while leaving the first set of memory cells 30 in the sleep mode. In this case, the second set of memory cells 32 are returned to an active state without requiring a wake up delay time.

In one application, a hand-held device includes a DRAM portion. The hand-held device allows access via telecommunications technology to interfaces such as the internet. When the user accesses the internet but remains idle for a period of time, the hand-held device is programmed to power down portions of the device, such as DRAM, i.e. enter low power mode. The hand-held device may then decide to place another module in low power mode and wake up DRAM. In this case, on return from low power mode, if a majority of memory cells were at a high logical level prior to power down, the first refresh may impair Vref in an N-channel memory array. The present invention provides a method for operating the DRAM which avoids this undesirable condition. The memory cells are written with a predetermined logical value appropriate to n-channel or p-channel devices.

In alternate embodiments, it is desirable to selectively refresh the memory array. This allows portions of the memory array to remain active while other portions are put in an inactive mode. The inactive mode may be used to reduce the power consumption of the memory array. By refreshing only a portion of the memory array, the charge necessary to perform refreshing is reduced. Similarly, the inactive mode may be used to reduce the noise occurring during refresh operations. By reducing the number of memory cells that are refreshed, the remaining refresh cycles may be distributed over a longer period of time, reducing the overall noise spectrum.

Figure 6:
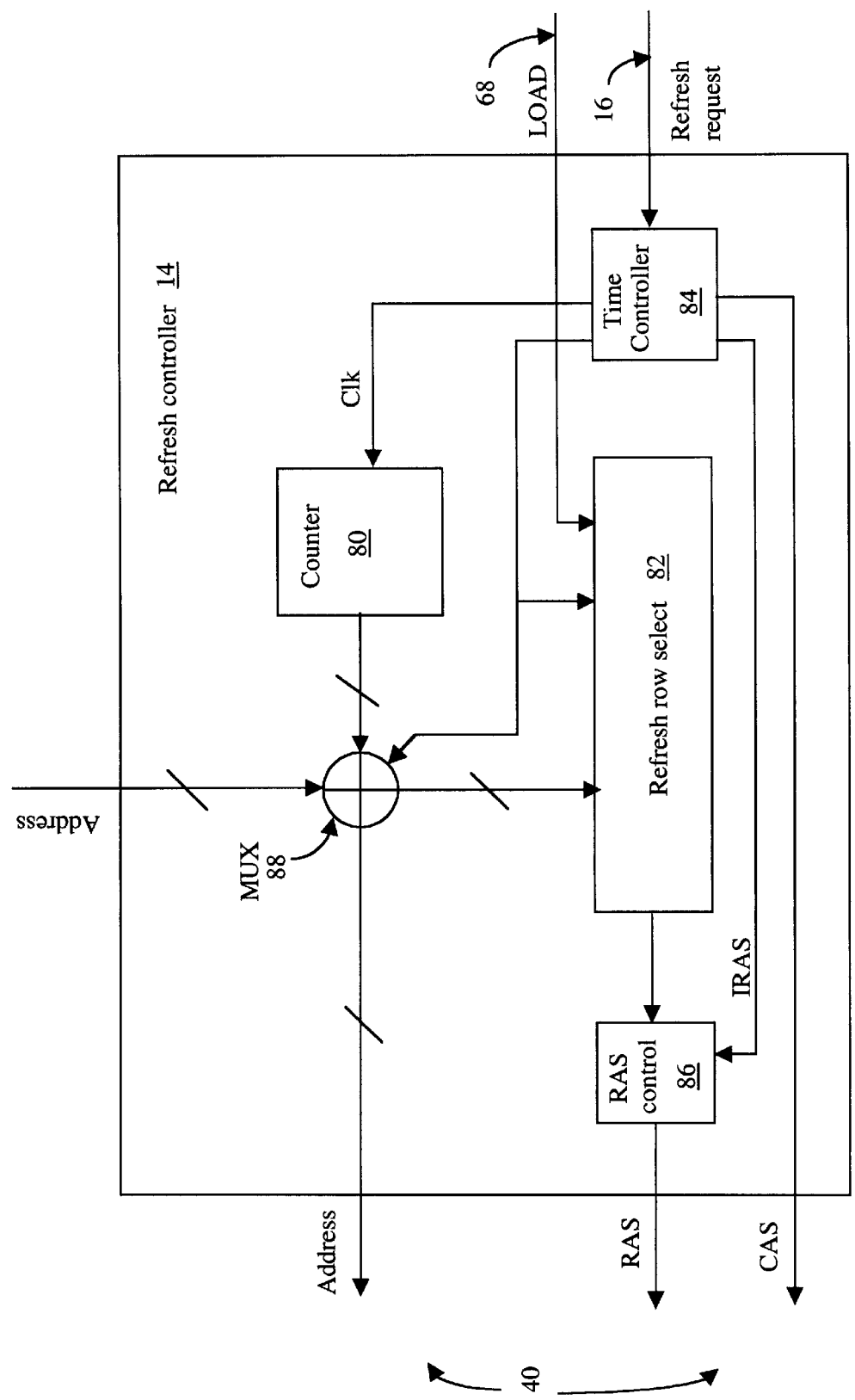
FIG. 6 illustrates in block diagram form a refresh controller of a memory device as in FIG. 1 which is in accordance with one embodiment of the present invention.

FIG. 6 illustrates the refresh controller 14 of FIG. 1, according to one embodiment of the present invention. Here, the refresh controller 14 allows selective refreshing of memory array 12. The refresh controller 14 includes a counter 80, a refresh row select 82, a RAS control 86, and a time controller 84. During normal operation, the refresh controller 14 receives ordinary memory access addresses from a processor or other requesting controller external to the refresh controller 14, and forwards each to the memory array via a MUX 88. At an appropriate time, depending upon the characteristics of the memory array, the time controller 84 will generate an internal row address strobe (IRAS) and an internal column address strobe (ICAS). During each such normal external access cycle, the refresh row select 82 will enable the RAS control 86 to output the IRAS as a normal row address strobe (RAS).

For each unit or element of the memory array that is capable of being put independently into the low power or sleep mode, e.g., a row or a set of rows, the refresh row select 82 has a corresponding storage location for storing an indication of the mode or state of the respective storage unit or element. In anticipation of entering the low power or sleep mode, the external controller determines which portions of the memory array will be placed in the low power or sleep mode, and which portions will remain in the active mode or state. Using load (LOAD) signals, the external controller stores corresponding indicators in the refresh row select 82 via the MUX 88. The LOAD signal is received via conductor 68.

Periodically, the time controller 84 receives a refresh request signal via conductor(s) 16, and, in response, provides a control signal to MUX 88 to output a row refresh address provided by counter 80 to the memory array. Simultaneously, the refresh row select 82 compares this row refresh address with the corresponding stored indicator. If the corresponding row is indicated as being active, the refresh row select 82 enables the RAS control 86 to output the IRAS as RAS. Otherwise, if the corresponding row is indicated as being in the low power or sleep state, the refresh row select 82 will disable the RAS control 86 and block RAS. In this way, the refresh row select 82 determines which rows, i.e. wordlines, are to be active, i.e. refreshed, and those that will not be refreshed and thus in the low power or sleep mode.

Continuing with FIG. 6, refresh row select 82 according to one embodiment of the present invention is a look-up table containing information corresponding to active and inactive rows. In this way, the most recently stored data may be updated in the look-up table, and made available for controlling the memory operating mode. In alternate embodiments, the refresh row select 82 may include a storage means, such as a register, with bits corresponding to wordlines in the memory array 12. Here a single bit may correspond to a wordline or multiple wordlines. The use of a storage means allows a mapping or encoding of wordlines which are to be refreshed, and allows noncontiguous memory units or elements to be refreshed. In other words, refresh row select 82 may provide for multiple sets of active wordlines with interposed sets of inactive wordlines. During refresh, only the active wordlines are refreshed, while the inactive wordlines are not refreshed. According to one scenario, the active wordlines are illustrated in FIG. 1 as the first set of memory cells 30 and second set of memory cells 32. Note that the first set of memory cells 30 and second set of memory cells 32 are not continuous wordlines, but rather comprise multiple wordlines in separate banks. Similarly, in alternate scenarios, a third set of memory cells may be included within bank 18 or bank 20.

Figure 7:
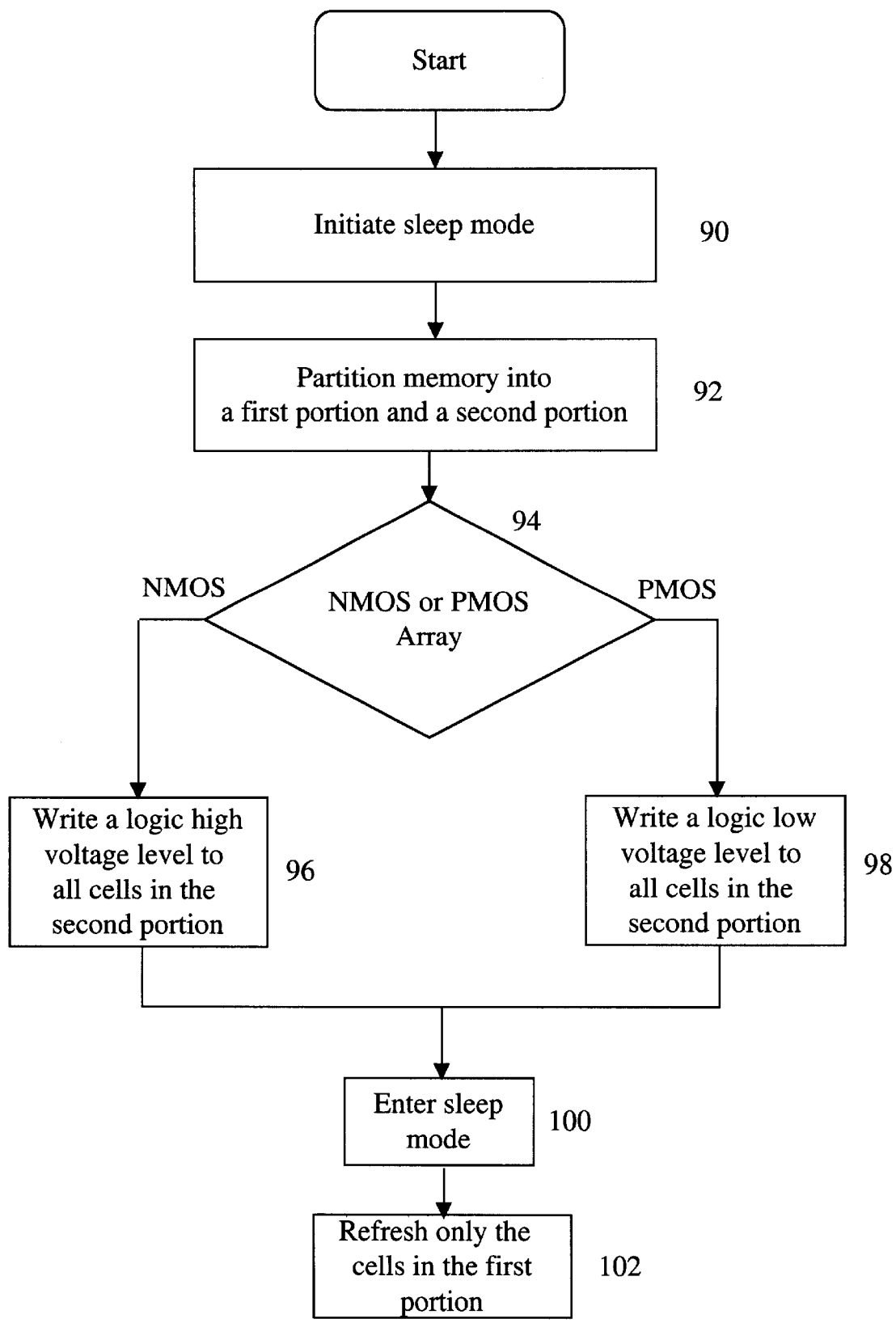
FIG. 7 illustrates in flow diagram form a method for operating a memory device having a low power mode which is in accordance with one embodiment of the present invention.

FIG. 7 illustrates a method of operating a memory device having refresh row select 82 as illustrated in FIG. 6. The low power mode is initiated at block 90. Processing flow continues to block 92 to determine a first set and a second set of memory cells within the memory array 12. As the conductivity type of the memory was determined during design, the path taken from decision diamond 94 is a based on that design decision. For N-channel devices the flow continues to block 96, and for P-channel devices the flow continues to block 98. At block 96, a logical high value is written to memory cells in the second set, or the inactive set of memory cells. At block 98, a logical low value is written to memory cells in the second set of memory cells. Processing then continues to block 100 to enter low power mode. Here, as in the process of FIG. 5, values are written to the inactive memory cells in preparation for return from the low power or sleep mode. Processing continues, in block 100, to refresh the first or active set of memory cells.

Figure 8:
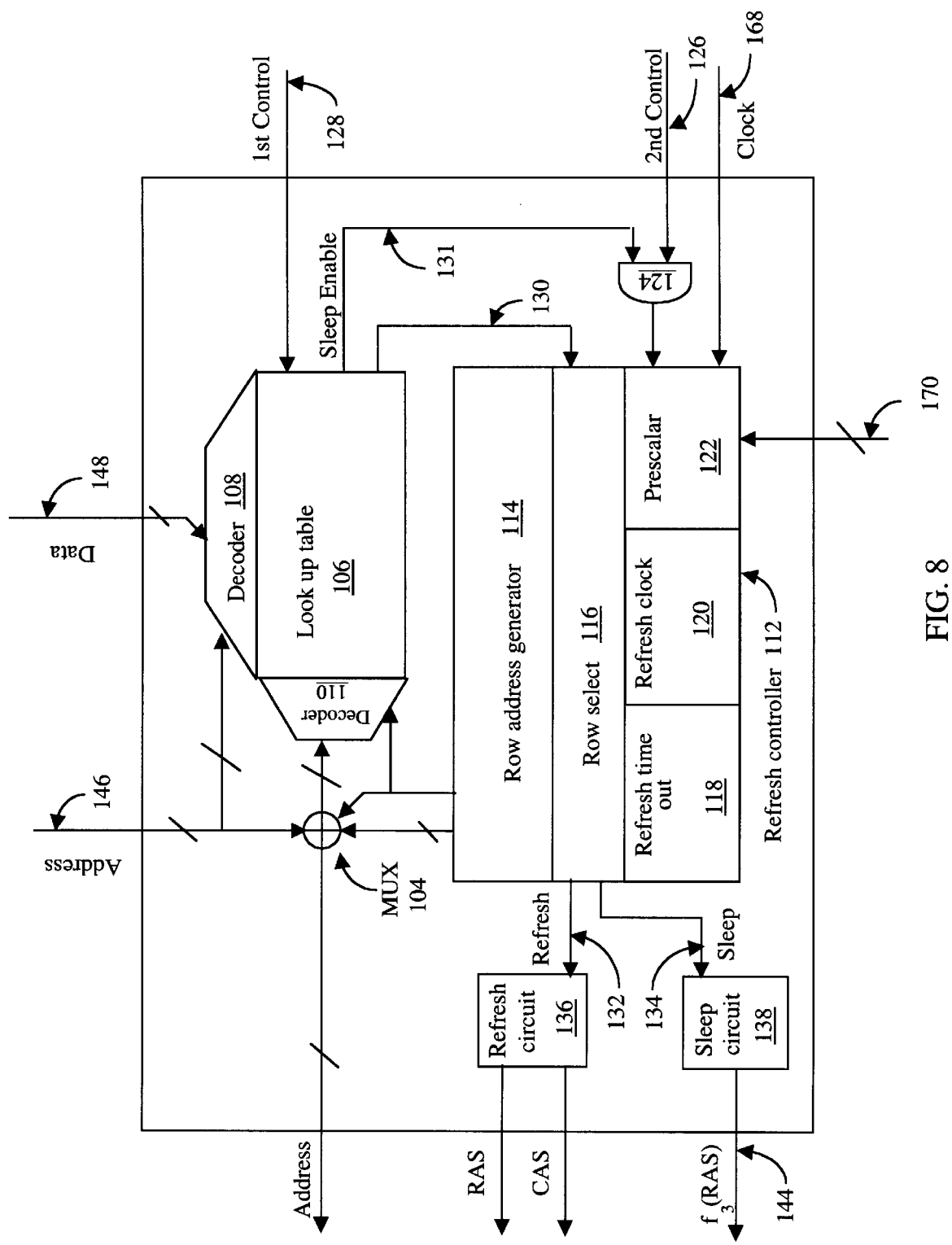
FIG. 8 illustrates in block diagram form a refresh controller in a memory system having a low power mode which is in accordance with one embodiment of the present invention.

We refer to the process of writing a predetermined value to the inactive memory cells as writing to the background, and it may be implemented in a number of ways. One embodiment is illustrated in FIG. 8, where the memory system includes a memory array and refresh circuitry. The refresh circuitry includes refresh controller 112 and look-up table 106. The refresh controller 112 includes row address generator 114, refresh time out 118, refresh clock 120, and a row select 116. The look-up table 106 includes decoder 108 and decoder 110. The look-up table 106 receives address information from address bus 146 and corresponding data information via conductors 148.

For each unit or element of the memory array that is capable of being put independently into the low power or sleep mode, e.g., a row or a set of rows, the look-up table 106 has a corresponding storage location for storing an indication of the mode or state of the respective storage unit or element. In anticipation of entering the low power or sleep mode, the external controller determines which portions of the memory array will be placed in the low power or sleep mode, and which portions will remain in the active mode or state. By applying pre-assigned address signals to the control inputs of decoder 108, the external controller can store corresponding indicators in the look-up table 106 via the decoder 110.

The data stored in the look-up table 106 indicates which memory cells are to remain active and which are to be made inactive, i.e. put into the sleep mode. For example, each bit of data in the look-up table 106 may indicate the operating mode of a respective one of the addressable units in the memory array, or, instead, one bit of data may represent an associated group or set of addressable units. The data in the look-up table 106 is stored and retrieved according to the addresses in the memory array. Thus, the look-up table 106 can be viewed as providing a mapping of memory address to corresponding locations of stored operating state data. According to one scheme, a logical high value stored in a selected location in the look-up table 106 corresponds to an active state, whereas a stored logic low value corresponds to an inactive or sleep state.

At an appropriate time, the look-up table 106 receives a first control signal via conductor 128 indicating that the look-up table is completed. In other words, when all locations in look-up table 106 have been written with operating state data, the first control signal will be asserted. The first control signal may be generated by any suitable external control unit, such as an appropriately programmed data processing system CPU or a dedicated microcontroller. In an alternate embodiment, the first control signal may be self-generated by the look-up table 106, wherein logic included within look-up table 106 detects when the last location in the look-up table has been written. In response to the first control signal, the look-up table 106 provides a sleep enable signal to AND gate 124. At an appropriate time, AND gate 124 receives a second control signal via conductor 126 from the external controller to initiate low power or sleep mode. When both the first and second control signals are asserted, the AND gate 124 enables the refresh controller 112 to initiate low power or sleep mode.

While in the low power or sleep mode, the refresh clock 120 will generate various refresh control clocks based upon an input clock (Clk). In response to receiving a predetermined number of the refresh control clocks, depending upon the characteristics of the memory array, the refresh time out 118 will initiate a refresh cycle. In response, the row address generator 114 will enable the MUX 104 to forward a next successive refresh address to the memory array. Simultaneously, the row address generator 114 enables the look-up table 106 to receive the refresh address via the decoder 110.

In response to each refresh address, the look-up table 106 provides a refresh indicator signal to the row select 116 via conductor 130. The refresh indicator signal indicates whether the current refresh address is active or inactive. An active address is to be refreshed, while an inactive address is to be placed in sleep mode. If the current refresh address is marked in the look-up table 106 as being active, the row select 116 will assert a refresh (Refresh) signal to enable the refresh circuit 136 to generate the appropriate RAS and CAS signals. If, on the other hand, the current refresh address is marked in the look-up table 106 as being inactive, the row select 116 will disable the refresh circuit 136 to prevent generation of the RAS and CAS signals.

In one embodiment of the present invention, when the current refresh address is first marked by the look-up table 106 as being inactive, the row select 116 asserts a sleep (Sleep) signal via conductor 134 to sleep circuit 138. In response, the sleep circuit 138 will write a predetermined background value into all memory cells associated with the current refresh address. In doing so, the sleep circuit 138 will destroy all true data stored in these memory cells. However, this data would have been lost in any event since it will no longer be periodically refreshed. On the other hand, for the reasons described above, the background value is especially selected to minimize the stress on the memory cells and the Vref generator circuits when these cells are once again placed in the active mode or state. Given the operating characteristics of these circuits, as described above, the background need only be written once to those portions of the memory array which are being placed in the low power or sleep mode or state, wherein it will be automatically maintained without refresh. As a direct consequence, these portions of the memory array can be immediately returned to the active mode or state without having to perform any start-up or warm-up cycles.

Note that alternate embodiments may use negation of these signals or some combination thereof. The refresh signal and the sleep signal initiate the appropriate action for the current refresh address. Similarly, a single conductor may be common to both the refresh circuit 136 and the sleep circuit 138, where one is responsive to assertion of the common signal, and the other is responsive to negation of the common signal. The method of effecting sleep mode or refresh mode may employ other circuitry, logical and/or analog, where the appropriate decision is made based on the refresh indicator signal.

Continuing with FIG. 8, refresh controller 112 also includes a programmable prescaler 122, which is coupled to an output of AND gate 124. The prescaler 122 functions to selectively adjust the length of time between each refresh cycle. Although not all memories are refreshed alike, typically, the entire memory array is sequentially refreshed during a particular refresh period, with one refresh address being refreshed each cycle. The present invention provides a method of refreshing a portion of the memory cells which is a subset of the entire array. According to one embodiment of the present invention, the prescaler acts to selectively adjust the time between successive refresh cycles for more efficient refresh of the active subset of refresh addresses. In addition, by spreading the reduced number of refresh cycles more evenly out over the refresh period, the peak power requirements can be reduced and the radiated noise spectrum may be improved.

Figure 9:
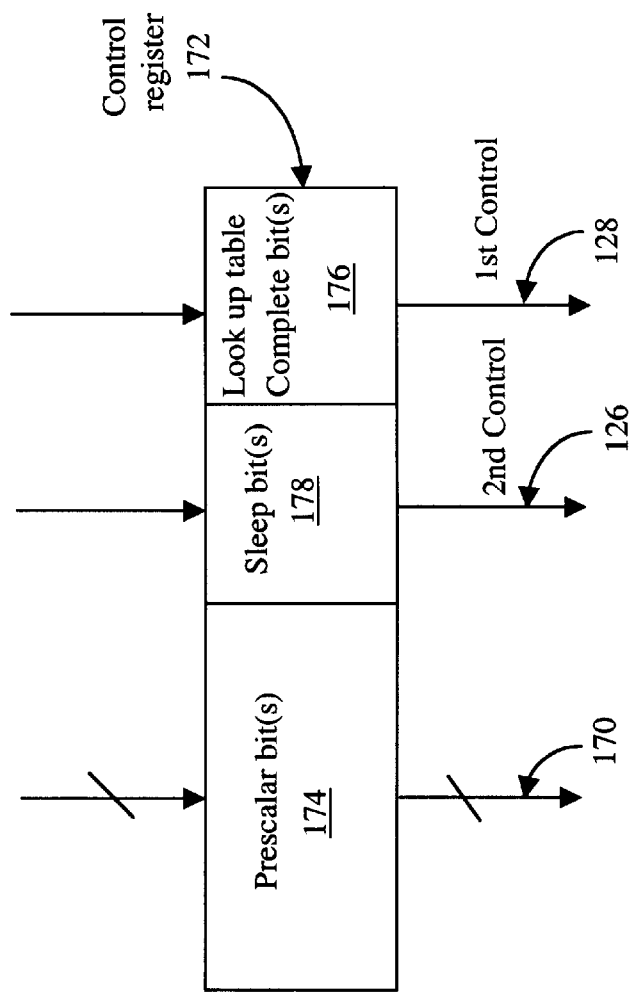
FIG. 9 illustrates in block diagram form a control register in a memory system as in FIG. 8 according to one embodiment of the present invention.

FIG. 9 illustrates a control register 172 in accordance with one embodiment of the present invention, having a first field for look-up table complete bit(s) 176 and a second field for sleep bit(s) 178. The control register 172 also includes prescalar bit(s) 174 and may include any number of bits having other significance. The control register 172 may be single register, or the bits comprising the control register 172 may be distributed in any appropriate manner within the memory device. In operation, the external controller can write the several control bits using conventional register addressing techniques, and thus indirectly generate the corresponding control signals to control the refresh controller 112 as shown in FIG. 8.

According to the present invention, a portion of memory designated as inactive is not refreshed during a sleep mode. Prior to entering sleep mode a predetermined voltage is stored in the memory cells in the inactive portion of memory. The predetermined value is considered a background value and may be stored explicitly by the processing unit. The MUX 104 selects between explicit storage, or automatic storage using look-up table 106. Once a refresh cycle begins, all refresh operations are controlled by refresh controller 112 using addresses from row address generator 114 via MUX 104. In contrast, the explicit write technique uses the conventional write function of the memory device, where a desired address is provided and the appropriate background value stored into the capacitor of the memory cell. In a N-channel device the predetermined value is a low voltage level, whereas in a P-channel device the predetermined value is a high voltage level.

Figure 10A:
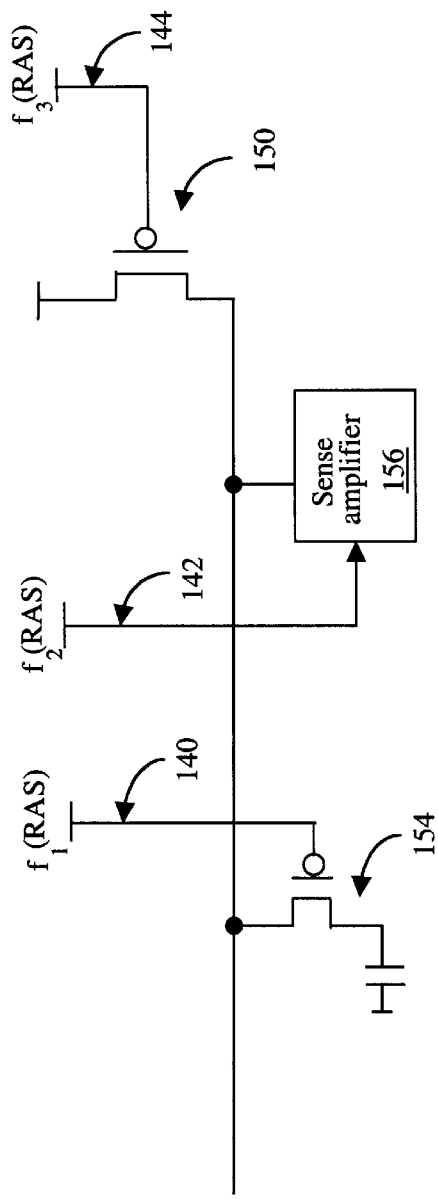
FIGS. 10a and 10b illustrate in partial block diagram and partial circuit diagram form sense amplifier killer circuitry which is in accordance with one embodiment of the present invention.
Figure 10B:
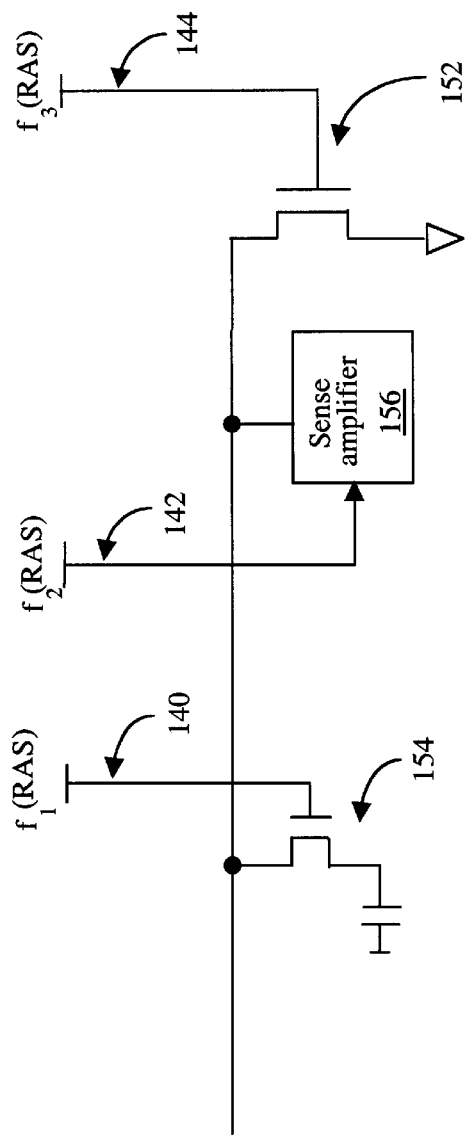

FIG. 10 illustrates means for automatically writing background values into the memory cells by use sense amplifier killer circuits. The memory cell 154 includes a pass transistor and a storage capacitor. The gate of the pass transistor is coupled to a wordline via conductor 140. A signal $f_1$ controls the gate of the transistor via conductor 140 as a function of RAS. Coupled to one side of the pass transistor is a sense amplifier 156 and N-channel killer transistor 152. The sense amplifier 156 is responsive to signal $f_2$ via conductor 142. On assertion of RAS in an N-channel device, the lower plate of the capacitor, such as bottom capacitor plate 54 of FIG. 2, is pulled down to ground or a low voltage level. This effectively writes a logical zero to the memory cell 154 as a background value. The N-channel killer transistor 152 is controlled by signal $f_3$ via conductor 144. Similarly, a P-channel killer transistor 150 is illustrated for use in a P-channel device, where assertion of RAS pulls the upper plate of the capacitor to a high voltage level as a background value. We call them killer transistors because, when turned on, they kill or prevent the operation of the sense amplifier 156.

Figure 11:
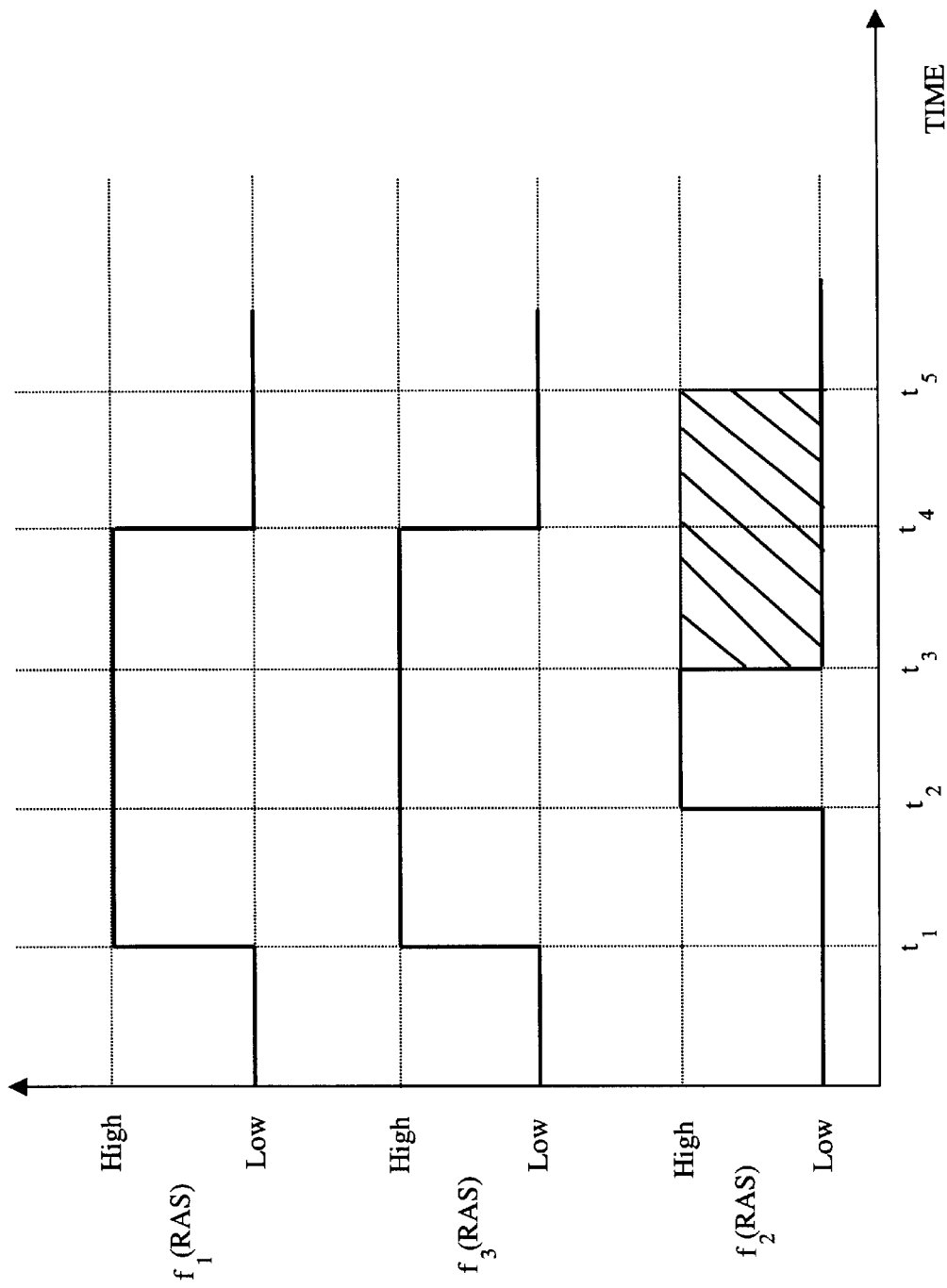
FIG. 11 illustrates in timing diagram form signals within sense amplifier killer circuitry as in FIG. 10b which is in accordance with one embodiment of the present invention.

In the timing diagram shown in FIG. 11, the signals $f_1$, $f_2$, $f_3$, originally shown in FIG. 8, are illustrated with respect to times $t_1$ through $t_5$. Thus, signal $f_1$, when applied to a particular wordline, turns on the pass transistors which couple the memory cells electrically to the respective bitlines, whereas the signal $f_2$ turns on the sense amplifiers, such as the sense amplifier 156 of FIG. 10, to initiate the refresh cycle. In general, the signals $f_1$ and $f_2$ are both functions of the RAS signal. In one embodiment, the signal $f_2$ is an appropriately-delayed version of the RAS signal. Finally, the signal $f_3$ turns on the gate of the killer transistor to write the background value. The signal $f_3$ is provided via conductor 144 to either the N-channel killer transistor 152 or the P-channel killer transistor 150.

Continuing with FIG. 11, the vertical axis represents the signals $f_1$, $f_2$, and $f_3$. Note that each signal is illustrated as active high signals by way of example. Alternate embodiments may employ any other scheme to identify active signals. The horizontal axis represents time. As illustrated, all three signals are initially negated, but at time $t_1$ signal $f_1$ is asserted. This strobes the selected refresh address of the current refresh cycle. Also at time $t_1$ signal $f_3$ is asserted, which turns on either the transistor of the N-channel killer transistor 152. An analogous low true signal could be used for the P-channel killer transistor 150 in a P-channel memory device. Note that the signal $f_3$ is generated by the sleep circuit 138 only when the current wordline is an inactive wordline. Assertion of the signal $f_3$ initiates the background write of the memory cells coupled to the current wordline. In a preferred form, this is only performed on the first refresh cycle following initiation of the low power or sleep mode of operation. On subsequent refresh cycles, RAS will not be asserted for this wordline as it is marked by the look-up table 106 as being inactive. In this case, the background write effectively stores a zero or low voltage level into memory cell 154. In this way, on return from sleep mode, the first access to memory cells on this wordline will not disrupt Vref.

Further illustrated in FIG. 11, the signal $f_2$ is asserted at time $t_1$ delayed from assertion of the signal $f_1$. The signal $f_2$ turns on sense amplifier 156 to start the refresh operation. The delay between signal $f_1$ and signal $f_2$ provides set up time for the refresh operation. One embodiment of the present invention takes advantage of this set up time to also turn on the sense amplifier killer transistors. As can be seen in FIG. 11, depending upon the particular design of the memory array and, in particular, the sense amplifier 22, the trailing edge ($t_3$, $t_4$, $t_5$) of the $f_2$ signal can occur either before, simultaneously with, or after the trailing edge of the $f_1$ and/or $f_3$ signal. The effect is to use the refresh cycle to write the background value to inactive memory cells. Once the background value is stored in the memory cells, these memory cells are ready to enter sleep mode and will not be refreshed while in sleep mode.

Prior to writing the background value into the inactive memory cells, it is first necessary to distinguish active from inactive memory cells. This may be done explicitly with a dedicated memory maintained by an external controller. However, this requires the controller to perform excessive overhead calculations and also requires the controller to then individually access each address to be put into the low power or sleep mode. One embodiment of the present invention employs a look-up table, such as that illustrated in FIG. 8 as look-up table 106. In one embodiment, as an internet web page is accessed, the system processing unit provides information specific to that web page to the look-up table 106. In this way, the current web page information stored in the memory array is designated as active, and will be refreshed during a sleep mode. This allows the current web page to stay active without refreshing the entire memory array. The present invention is applicable to any number of such applications where a portion of data stored in the memory array is to be refreshed, while other portions need not be refreshed in sleep mode.

Figure 16:
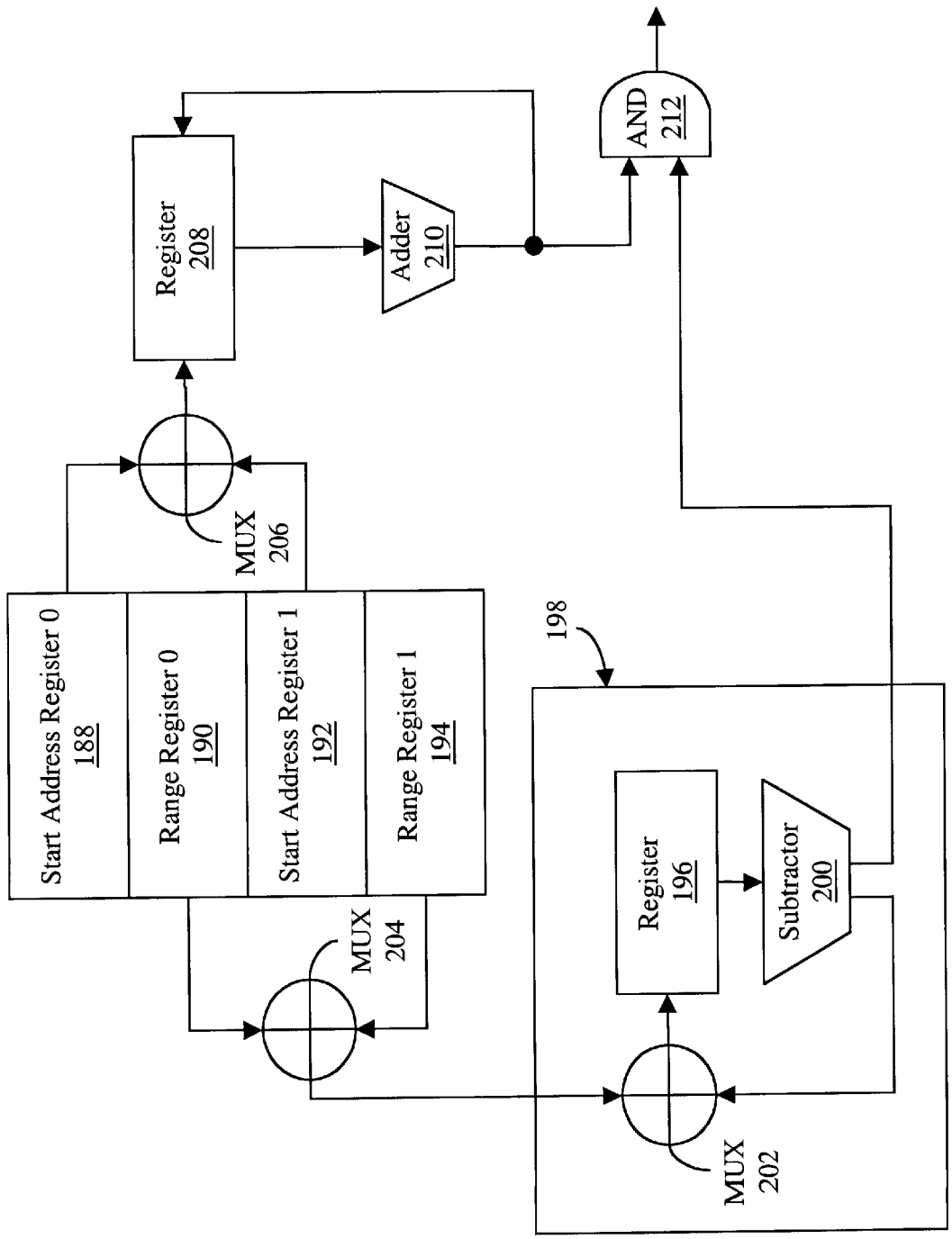
FIG. 16 illustrates in block diagram form circuitry for defining the active/inactive status of multiple areas of a memory by use of multiple registers which is in accordance with one embodiment of the present invention.

Another embodiment of the present invention is illustrated in FIG. 16, which provides the active or inactive status of areas of memory by use of multiple registers. A first start address register 188 stores the start address of a first portion of the memory array, and a second start address register 192 stores the start address of a second portion of the memory array. For each of the first and second portions of the memory array, the first range register 190 stores information indicating the length or range of the first portion starting at the first start address, and the second range register 194 stores information indicating the length or range of the second portion starting at the second start address.

The first start address register 188 and the second start address register 192 are coupled to the inputs of a MUX 206, the output of which is coupled to the register 208. Once a selected one of the first or second start addresses has been stored in the register 208, the value is provided to the adder 210 where the value is incremented, and the incremented value is provided as feedback to the register 208. Similarly the first range register 190 and the second range register 194 are coupled to the inputs of a MUX 204, the output of which is coupled to range counter 198. Once a corresponding one of the first or second range addresses has been stored in a register 196 via a MUX 202, the value is provided to a subtractor 200 where the value is decremented, and the decremented value is provided as feedback to the register 196. So long as the value in the register 196 is greater than zero, indicating that the address being provided by the adder 210 is within one of the preselected address ranges, the subtractor 200 negates an underflow signal to AND gate 212 to pass the addresses provided by the adder 210. When the value in the register 196 is decremented to zero, the subtractor 200 asserts the underflow signal to AND gate 212 to block the addresses provided by the adder 210. Thus, refresh addresses will be provided for only those addresses which are within either the first or second address ranges.

Figure 14:
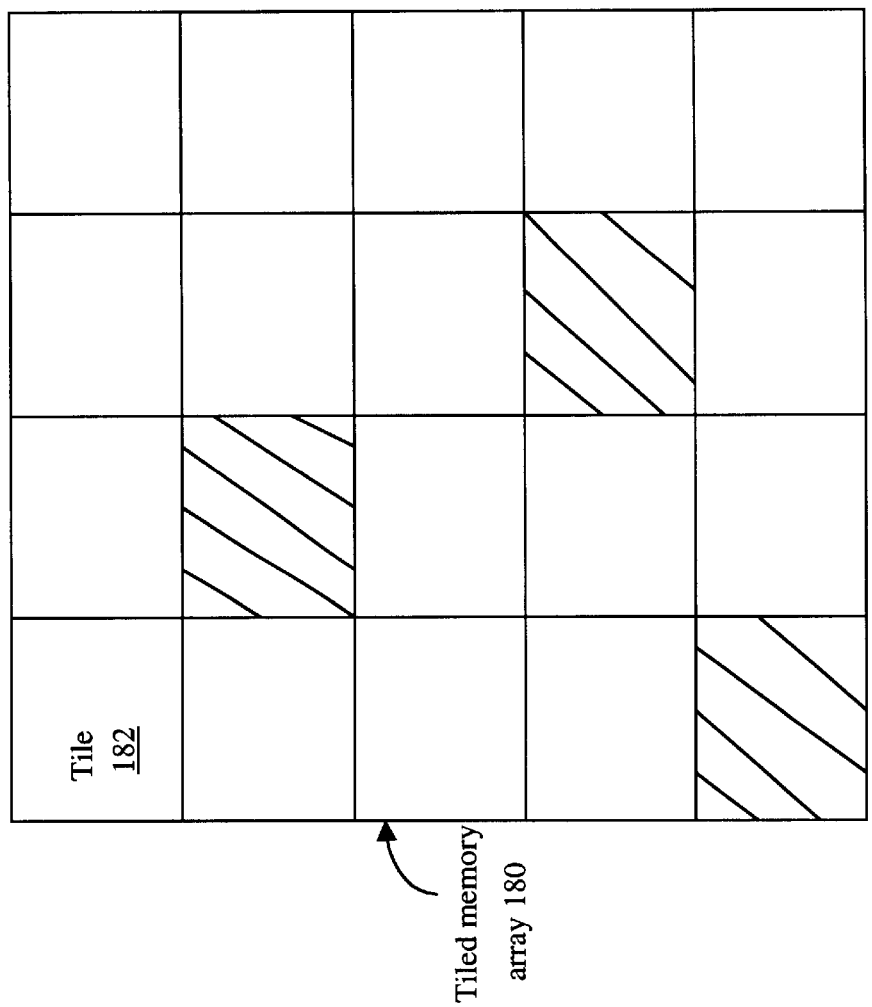
FIG. 14 illustrates in block diagram form a tiled memory having inactive and active tiles, which is in accordance with one embodiment of the present invention.

According to the embodiment illustrated by way of example in FIG. 8, all addresses in the memory array have corresponding storage locations in the look-up table 106. We refer to this arrangement as a "common look-up table". In an alternate embodiment, the look-up table is distributed throughout the memory array. This is typical of a tiled memory, such as those described in our copending applications. We refer to the latter arrangement as a "distributed look-up table". The distributed look-up table provides some advantages over the common look-up table. For example, in a tiled memory array 180, such as that illustrated in FIG. 14, it may be desired to inactivate an entire tile 182, such as those having cross-hatch lines. By associating with each tile a respective portion of the look-up table mechanism, the power required to perform the look-up function can be reduced.

Figure 15:
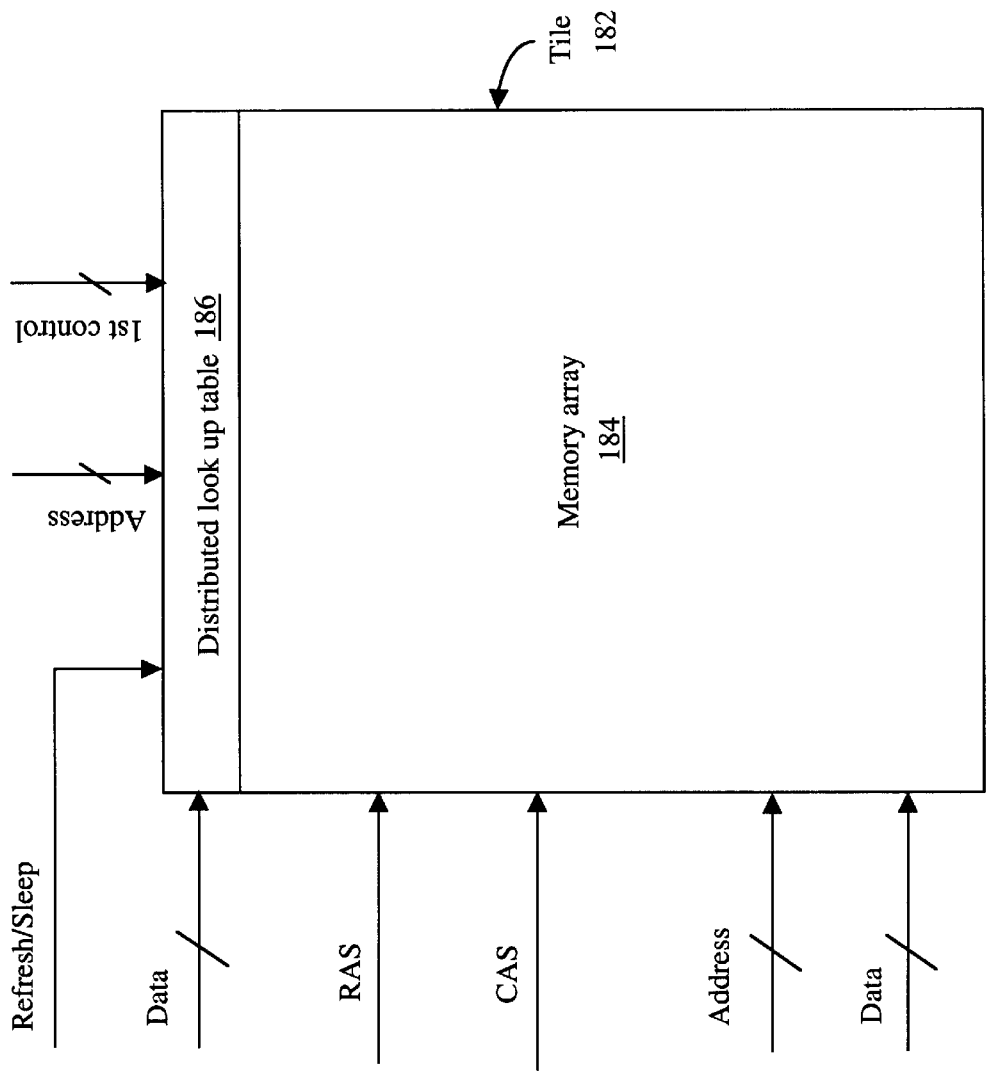
FIG. 15 illustrates in block diagram form an individual memory tile within a tiled memory as in FIG. 14 having a distributed look-up table for use with a refresh controller as in FIG. 8 which is in accordance with one embodiment of the present invention.

Illustrated in FIG. 15 is an example memory array portion 184 and a distributed look-up table 186. Data and control signals are provided to both the tile 182 and the distributed look-up table 186 by way of multiple conventional conductors. In addition, however, the refresh indicator signals (Refresh/Sleep), generated by refresh controller 112 (FIG. 8), is provided to the distributed look-up table 186. In this way, mode control for each tile 182 is provided from within that memory array portion 184, and each memory array portion 184 decides locally which refresh addresses, if any, are to be refreshed or put to sleep.

Returning to FIG. 8, one embodiment of the present invention provides a means for pipelining access to the refresh mode information. According to this embodiment, the data stored in a particular location in the look-up table 106 is associated with the next successive refresh address. This is easily achieved by left-shifting by one location the data as it is loaded into the look-up table 106. During power-on-reset, the refresh controller 112 will perform an initialization access to the look-up table 106 to fetch the mode information for the first refresh address to be refreshed upon exiting reset. Thereafter, the last output of the look-up table 106 will be the mode information for the next refresh address. This reduces latency in the refresh operation, as the row select 116 need not wait for the refresh indicator signal from the look-up table 106, since it was provided on the last cycle. We refer to this technique as "pipelined look-up".

Figure 12:
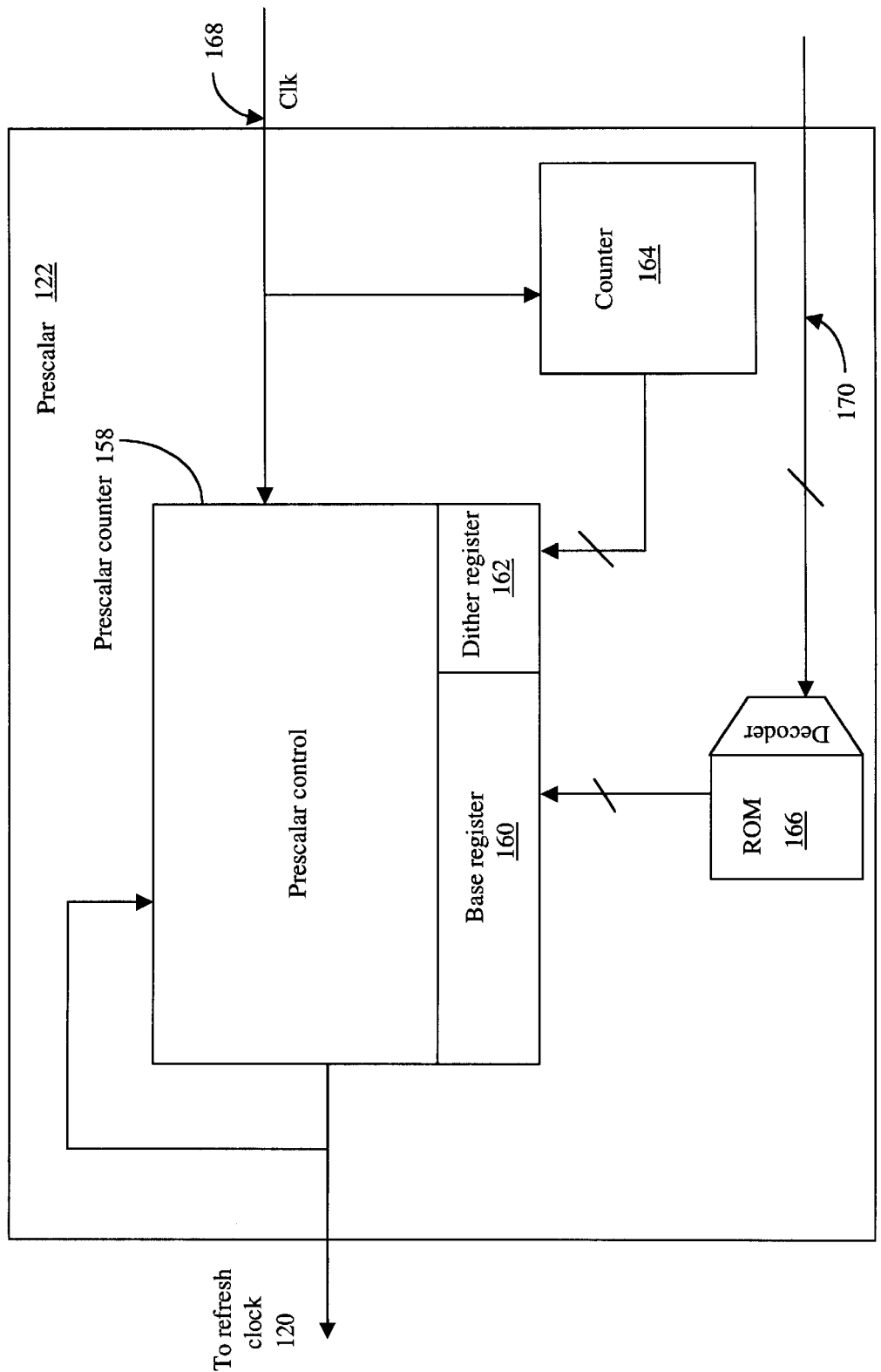
FIG. 12 illustrates in block diagram form a prescaler for use with a refresh controller as in FIG. 8 which is in accordance with one embodiment of the present invention.

Referring now to FIG. 12, the prescaler 122 is further detailed according to one embodiment of the present invention. The prescaler 122 includes a prescaler counter 158, a ROM 166, and a counter 164. The prescaler 122 receives a system clock (Clk) via a conductor 168. The system clock provides the clock for both the prescaler counter 158, and the counter 164. Within the prescaler counter 158 is a down-counter comprising a high-order or base register 160 and a low-order or dither register 162. In operation, a prescale select signal provided by the system CPU or controller on a conductor 170 enables the ROM 166 to provide a selected one of a plurality of possible prescale base values. Each time the prescaler counter 158 counts down to zero, the prescale base value then being provided by the ROM 166 is loaded in the base register 160. Simultaneously, the current value of selected bits of the counter 164 are loaded into the dither register 162. Thereupon, the prescaler counter 158 will resume down-counting. By concatenating a few, essentially random, bits from the counter 164 as a low-order extension to the selected prescale base value, the prescaler 122 facilitates pseudo-random noise spectrum spreading and distribution of the refresh cycles throughout a refresh period.

Figure 13:
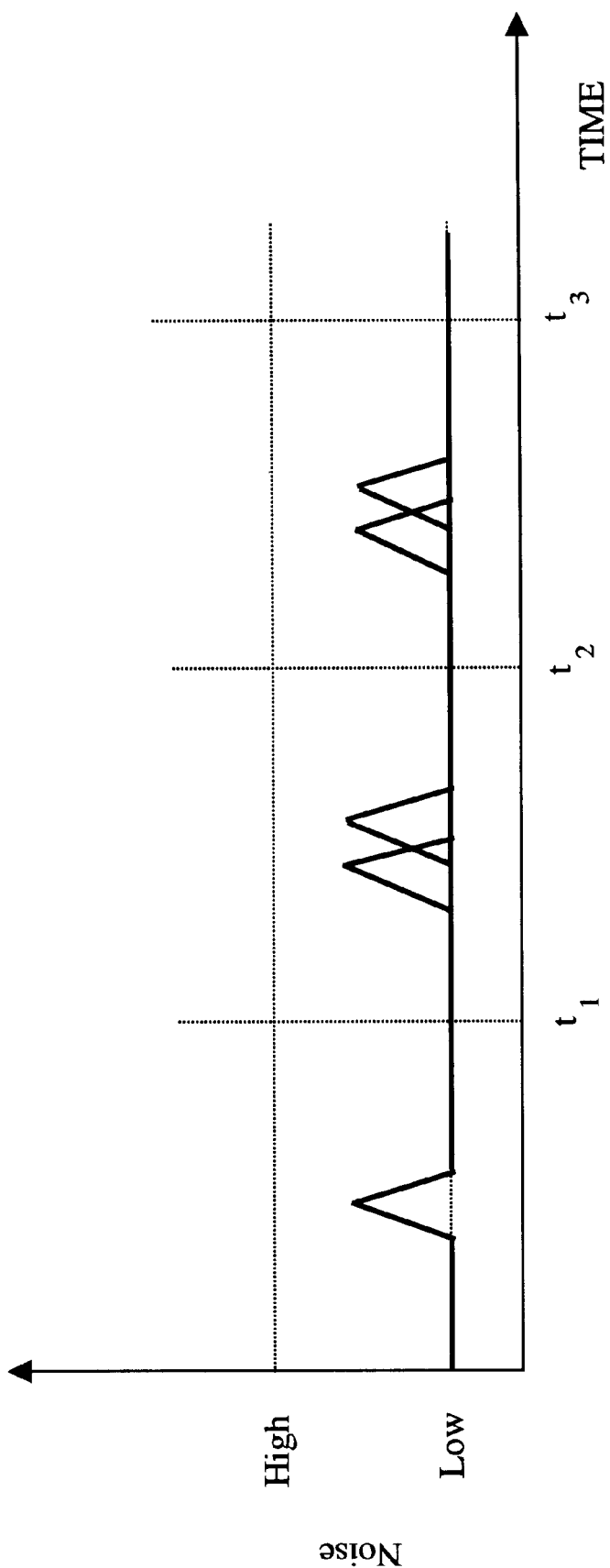
FIG. 13 illustrates in timing diagram form, noise signals generated within the memory system of FIG. 8 during refresh operations according to one embodiment of the present invention.

Preferably, the ROM 166 stores prescale base values corresponding to one or more of the possible ratios of active to inactive rows, and the controller will select the appropriate one depending upon the current ratio of active to inactive rows. In this arrangement, the data stored in ROM 166 allows the prescaler 122 to flexibly vary the period and/or duty cycle of the refresh cycle to reduce noise. For example, shown in FIG. 13 is a stylized representation of the noise generated by the transition of signals used for refresh operations. The vertical axis represents the noise, with two levels of noise indicated as Low and High. The horizontal axis represents time, and each time period corresponds to a refresh cycle. During the first refresh cycle the noise occurs in the middle of the period. During the second and third refresh cycles, without the present invention, the noise would again appear in the middle of the cycle. However, using our dither technique, the noise generated by the transition of signals used for refresh operations will occur at slightly different times in each cycle. In particular, by using a few bits extracted from the counter 164, the dither effect shifts the refresh event within a predetermined time window. Using our technique, the noise spectrum may be improved. If this effect is not desired, the dither register 162 and the counter 164 may be omitted.

In one embodiment, a programmable data processor operates a memory having a plurality of dynamic memory cells arranged in a plane of rows and columns. The processor includes a row refresh means connected to the memory to refresh a selected row of memory cells, and row select means connected to the row refresh circuit to select a first row of the memory to be refreshed, and then select a second row of the memory to be refreshed, where the first and second rows may be any two rows of the memory. The row select means may include a look-up table having a plurality of storage locations, each associated with a predetermined row of the memory, the look-up table being adapted to selectively store a first predetermined value for each row to be refreshed and a second predetermined value otherwise. The programmable data processor may be programmed to perform these functions using an appropriate computer program. Note that the computer program may be stored in other computer readable medium and accessed by the programmable data processor.

Thus it is apparent that there has been provided, in accordance with the present invention, an integrated circuit having a sleep mode, which may be a low power mode or a noise reduction mode, wherein the memory is partitioned into at least one inactive region, which is not refreshed during the sleep mode. Prior to entering the sleep mode, a predetermined value is written to memory cells within the inactive region. When the inactive region is later returned to an active state, the values which were previously written into the memory cells, but never refreshed, prevent damage and malfunction of the memory device and specifically the reference voltage coupled to one of the plates of the storage capacitors in the memory cells. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What we claim is:

1. An integrated circuit comprising:
    a memory comprising a plurality of dynamic memory cells arranged in a plane of rows and columns; and
    a refresh controller comprising:
        a row refresh circuit connected to the memory to refresh a selected row of memory cells; and
        a row select circuit connected to the row refresh circuit to select a first row of the memory to be refreshed, and then select a second row of the memory to be refreshed, wherein the first and second rows may be any two rows of the memory.

2. The integrated circuit of claim 1 wherein the row select circuit comprises a look-up table having a plurality of storage locations, each associated with a predetermined row of the memory, the look-up table being adapted to selectively store a first predetermined value for each row to be refreshed and a second predetermined value otherwise.

3. The integrated circuit of claim 2 wherein the memory is further characterized as comprising a plurality of memory tiles, each comprising a plurality of dynamic memory cells arranged in rows and columns, and wherein the look-up table comprises a plurality of slices, each slice corresponding to a respective one of the plurality of memory tiles and adapted to selectively store the first predetermined value for each row in the corresponding memory tile to be refreshed and the second predetermined value for each row in the corresponding memory tile which is not to be refreshed.

4. The integrated circuit of claim 3 wherein each slice of the look-up table is integrated in the corresponding memory tile.

5. The integrated circuit of claim 2 wherein the row select circuit selects rows in a predetermined refresh order, wherein the storage locations in the look-up table are also accessed in the predetermined refresh order, and wherein each storage location in the look-up table stores a selected one of the first and second predetermined values for the current row being selected by the row select circuit.

6. The integrated circuit of claim 5 wherein each row is refreshed during a refresh cycle, and wherein the interval between each refresh cycle is selectable.

7. The integrated circuit of claim 6 wherein the intervals between refresh cycles comprising said refresh order are selected to be distributed substantially evenly over time.

8. The integrated circuit of claim 5 wherein each storage location in the look-up table stores the selected one of the first or second predetermined values for the row next to be selected by the row select circuit.

9. The integrated circuit of claim 2 wherein the refresh controller further comprises:
a sleep circuit connected to the look-up table to store a third predetermined value in each of the memory cells in each row of the memory for which the corresponding storage location in the look-up table stores the second predetermined value.

10. The integrated circuit of claim 1 wherein the refresh controller further comprises a refresh timer connected to the row refresh circuit and the row select circuit to control refresh timing.

11. The integrated circuit of claim 10 wherein the refresh timer comprises:
a refresh clock generator to periodically generate refresh clock pulses; and
a refresh timeout counter connected to the refresh clock generator to count the refresh clock pulses and, after counting a predetermined number of the refresh clock pulses, provide a refresh timeout pulse to initiate a refresh cycle.

12. The integrated circuit of claim 11 wherein the refresh clock generator is further characterized as being adapted to receive a reference clock, the refresh clock generator counting pulses of the reference clock, and, after counting a selected number of the reference clock pulses, generating each refresh clock pulse.

13. The integrated circuit of claim 12 wherein the refresh clock generator comprises:
a prescaler look-up table to provide a selected one of a plurality of stored prescale values; and
a refresh clock counter connected to the prescaler look-up table and adapted to receive the reference clock, the refresh clock counter storing the selected one of the prescale values, modifying the stored value by a predetermined amount in response to each received reference clock pulse, and, upon detecting a predetermined stored value, providing the refresh clock pulse.

14. The integrated circuit of claim 13 wherein the refresh clock generator includes a counter to generate a continuously variable dither value, and wherein the refresh clock counter is connected to the counter, the refresh clock counter storing the selected one of the prescale values as a high-order portion of the stored value and the dither value as a low-order portion of the stored value.

15. The integrated circuit of claim 1 wherein the refresh controller further comprises:
a sleep circuit connected to the row select circuit to selectively store a sleep value in each of the memory cells in all rows of the memory other than said first and second rows.

16. The integrated circuit of claim 15 wherein the sleep circuit includes a row write control circuit connected to each row of the memory to directly write the sleep value in each of the memory cells in each row of the memory other than said first and second rows.

17. The integrated circuit of claim 15 wherein the sleep circuit stores said sleep value in said memory cells once and only once.

18. The integrated circuit of claim 1 wherein the row select circuit selects a first set of rows of the memory to be refreshed, and then selects a second set of rows of the memory to be refreshed, wherein the first and second sets of rows may be any two sets of rows of the memory.

19. The integrated circuit of claim 18 wherein the row select circuit comprises a look-up table having a plurality of storage locations, each associated with a predetermined set of rows of the memory, the look-up table being adapted to selectively store a first predetermined value for a set of rows to be refreshed and a second predetermined value otherwise.

20. The integrated circuit of claim 1 wherein the row select circuit comprises a first row select circuit which selects the first row of the memory to be refreshed, and a second row select circuit which selects the second row of the memory to be refreshed.

21. The integrated circuit of claim 1 wherein row select circuit comprises a first row select circuit which selects a first set of rows of the memory to be refreshed, and a second row select circuit which selects a second set of rows of the memory to be refreshed, wherein the first and second sets of rows may be any two sets of rows of the memory.

22. The integrated circuit of claim 1 wherein the row select circuit, in a normal operating mode, selects each row of the memory for refresh once during a predetermined refresh period, and, in a sleep mode, distributes the refresh of the first and second rows of the memory relatively evenly over each refresh period.

23. A refresh controller for use in an integrated circuit having a memory comprising a plurality of dynamic memory cells arranged in a plane of rows and columns, the refresh controller comprising:
a row refresh circuit connected to the memory to refresh a selected row of memory cells; and
a row select circuit connected to the row refresh circuit to select a first row of the memory to be refreshed, and then select a second row of the memory to be refreshed, wherein the first and second rows may be any two rows of the memory.

24. The refresh controller of claim 23 wherein the row select circuit comprises a look-up table having a plurality of storage locations, each associated with a predetermined row of the memory, the look-up table being adapted to selectively store a first predetermined value for each row to be refreshed and a second predetermined value otherwise.

25. The refresh controller of claim 24 wherein the memory is further characterized as comprising a plurality of memory tiles, each comprising a plurality of dynamic memory cells arranged in a plane of rows and columns, and wherein the look-up table comprises a plurality of slices, each slice corresponding to a respective one of the plurality of memory tiles and adapted to selectively store the first predetermined value for each row in the corresponding memory tile to be refreshed and the second predetermined value otherwise.

26. The refresh controller of claim 25 wherein each slice of the look-up table is integrated in the corresponding memory tile.

27. The refresh controller of claim 24 wherein the row select circuit selects rows in a predetermined refresh order, wherein the storage locations in the look-up table are also accessed in the predetermined refresh order, and wherein each storage location in the look-up table stores a selected one of the first and second predetermined values for the current row being selected by the row select circuit.

28. The refresh controller of claim 27 wherein each storage location in the look-up table stores the selected one of the first or second predetermined values for the row next to be selected by the row select circuit.

29. The refresh controller of claim 24 wherein the refresh controller further comprises:
a sleep circuit connected to the look-up table to store a third predetermined value in each of the memory cells in each row of the memory for which the corresponding storage location in the look-up table stores the second predetermined value.

30. The refresh controller of claim 23 wherein the refresh controller further comprises a refresh timer connected to the row refresh circuit and the row select circuit to control refresh timing.

31. The refresh controller of claim 30 wherein the refresh timer comprises:
a refresh clock generator to periodically generate refresh clock pulses; and
a refresh timeout counter connected to the refresh clock generator to count the refresh clock pulses and, after counting a predetermined number of the refresh clock pulses, provide a refresh timeout pulse to initiate a refresh cycle.

32. The refresh controller of claim 31 wherein the refresh clock generator is further characterized as being adapted to receive a reference clock, the reference clock generator counting pulses of the reference clock, and, after counting a selected number of the reference clock pulses, generating each refresh clock pulse.

33. The refresh controller of claim 32 wherein the reference clock generator comprises:
a prescaler look-up table to provided a selected one of a plurality of stored prescale values; and
a refresh clock counter connected to the prescaler look-up table and adapted to receive the reference clock, the refresh clock counter storing the selected one of the prescale values, modifying the stored value by a predetermined amount in response to each received reference clock pulse, and, upon detecting a predetermined stored value, providing the refresh clock pulse.

34. The refresh controller of claim 33 wherein the reference clock generator includes a counter to generate a continuously variable dither value, and wherein the refresh clock counter is connected to the counter, the refresh clock counter storing the selected one of the prescale values as a high-order portion of the stored value and the dither value as a low-order portion of the stored value.

35. The refresh controller of claim 23 wherein the refresh controller further comprises:
a sleep circuit connected to the row select circuit to selectively store a sleep value in each of the memory cells in all rows of the memory other than said first and second rows.

36. The refresh controller of claim 35 wherein the sleep circuit includes row write control circuit connected to each row of the memory to directly write the sleep value in each of the memory cells in each row of the memory other than said first and second rows.

37. The refresh controller of claim 35 wherein the sleep circuit is operable only during a first refresh.

38. The refresh controller of claim 23 wherein the row select circuit selects a first set of rows of the memory to be refreshed, and then selects a second set of rows of the memory to be refreshed, wherein the first and second sets of rows may be any two sets of rows of the memory.

39. The refresh controller of claim 38 wherein the row select circuit comprises a look-up table having a plurality of storage locations, each associated with a predetermined set of rows of the memory, the look-up table being adapted to selectively store a first predetermined value for a set of rows to be refreshed and a second predetermined value otherwise.

40. The refresh controller of claim 23 wherein the row select circuit comprises a first row select circuit which selects the first row of the memory to be refreshed, and a second row select circuit which selects the second row of the memory to be refreshed.

41. The integrated circuit of claim 23 wherein row select circuit comprises a first row select circuit which selects a first set of rows of the memory to be refreshed, and a second row select circuit which selects a second set of rows of the memory to be refreshed, wherein the first and second sets of rows may be any two sets of rows of the memory.

42. The refresh controller of claim 23 wherein the row select circuit, in a normal operating mode, selects each row of the memory for refresh once during a predetermined refresh period, and, in a sleep mode, distributes the refresh of the first and second rows of the memory relatively evenly over each refresh period.

43. A refresh controller for use in an integrated circuit having a memory comprising a plurality of dynamic memory cells arranged in a plane of rows and columns, the refresh controller comprising:
a row refresh circuit connected to the memory to refresh a selected row of memory cells;
a row select circuit connected to the row refresh circuit to select a first row of the memory to be refreshed, and then select a second row of the memory to be refreshed, wherein the first and second rows may be any two rows of the memory; and
a sleep circuit to write a sleep value once to each memory cell in all rows of the memory other than the first and second rows.

44. A programmable data processor for operating a memory comprising a plurality of dynamic memory cells arranged in a plane of rows and columns, the processor comprising:
row refresh means connected to the memory to refresh a selected row of memory cells; and row select means connected to the row refresh circuit to select a first row of the memory to be refreshed, and then select a second row of the memory to be refreshed, wherein said first and second rows may be any two rows of the memory.

45. The programmable data processor of claim 44 wherein the row select means comprises a look-up table having a plurality of storage locations, each associated with a predetermined row of the memory, the look-up table being adapted to selectively store a first predetermined value for each row to be refreshed and a second predetermined value otherwise.

* * * * *